(12) United States Patent
Kitoh et al.

(10) Patent No.: US 6,256,331 B1
(45) Date of Patent: Jul. 3, 2001

(54) SEMICONDUCTOR LASER DEVICE, OPTICAL COMMUNICATION SYSTEM USING THE SAME, AND METHOD FOR PRODUCING COMPOUND SEMICONDUCTOR

(75) Inventors: Masahiro Kitoh; Masato Ishino; Yasushi Matsui, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/130,311

(22) Filed: Aug. 7, 1998

(30) Foreign Application Priority Data

Aug. 8, 1997 (JP) ................................. 9-214482
Apr. 3, 1998 (JP) ................................. 10-091217
Apr. 3, 1998 (JP) ................................. 10-091219

(51) Int. Cl.$^7$ ..................................... H01S 3/19
(52) U.S. Cl. .................. 372/46; 372/46; 372/43; 372/44; 372/96; 372/75
(58) Field of Search ................... 372/46, 43, 44, 372/96, 75

(56) References Cited

U.S. PATENT DOCUMENTS

| | | | |
|---|---|---|---|
| 4,805,183 | * | 2/1989 | Kudo et al. ............... 372/96 |
| 4,905,057 | * | 2/1990 | Ohishi et al. ............. 372/48 |
| 5,228,048 | * | 7/1993 | Takemoto et al. ......... 372/46 |
| 5,410,167 | * | 4/1995 | Saito ......................... 257/192 |
| 6,057,560 | * | 5/2000 | Uchida ...................... 257/94 |
| 6,064,079 | * | 5/2000 | Yamamoto et al. ........ 257/101 |

FOREIGN PATENT DOCUMENTS 09315899 3/1997 (JP).

OTHER PUBLICATIONS

Larson, M. et al., "Room Temperature Continuous–Wave Photopumped Operation of 1.22$\mu$m GaInNAs/GaAs Single Quantum Well Vertical–Cavity Surface–Emitting Laser" Electronics Letters, GB, IEE Stevenage, vol. 33, No. 11, May 22, 1997, pp. 959–960.

Kondow, M. et al., "Gas–Source Molecular Beam Epitaxy of GaNxAs1–x Using a N Radical as the N Source", Japanese Journal of Applied Physics, vol. 33, No. 8A, Part 2, Aug. 1, 1994, pp. L1056–L1058.

(List continued on next page.)

*Primary Examiner*—Frank G. Font
*Assistant Examiner*—Delma R. Flores Ruiz
(74) *Attorney, Agent, or Firm*—McDermott, Will & Emery

(57) ABSTRACT

The semiconductor laser device of the present invention includes a GaAs substrate and a multi-layer structure formed on the GaAs substrate. The multi-layer structure includes an active layer for emitting light. The active layer includes an $InN_xAs_yP_{1-x-y}$ (where $0<x<1$ and $0\leq y<1$) layer that is lattice-matched with the GaAs substrate.

49 Claims, 21 Drawing Sheets

OTHER PUBLICATIONS

Sato, S. et al., "Room–Temperature Pulsed Operation of 1.3μm GaInNAs/GaAs Laser Diode", Electronic Letters, vol. 33, No. 16, Jul. 31, 1997, pp. 1386–1387.

Bi, W. et al., "InNAsP Microdisk Lasers Lasing Above Room Temperature", Proceedings of the 1997 Conference on Lasers and Electro–Optics, May 1997, vol. 11, p. 316.

Kondow, M. et al., "GaInNAs: A Novel Material for Long–Wavelength Semiconductor Lasers", IEEE Journal of Selected Topics in Quantum Electronics, vol. 3, No. 3, Jun. 1997 pp. 719–729.

Nakahara, K. et al., "Continuous–Wave Operation of Long–Wavelength GaInNAs/GaAs Quantum Well", Electronics Letters, vol. 32, No. 17, Aug. 1996 pp. 1585–1586.

Okuno, Y. et al., "Anti–Phase Direct Bonding and its Application to the Fabrication of InP–based 1.55 μm Wavelength Lasers on GaAs Substrates", Applied Physics Letters, Institute of Physics, vol. 66, No. 4, Jan. 1995, pp. 451–453.

Speier, P., "MOVPE for Optoelectronics" Microelectronic Engineering, vol. 18, No. 1/2, May 1992, pp. 1–31.

W.G. Bi, et al., "Improved High–Temperature Performance of 1.3–1.5–μm InGaAsP Quantum–Well Microdisk Lasers". IEEE Photonics Technology Letters. vol. 9, No. 8, pp. 1072–1074, Aug. 1997.

W.G. Bi, et al., "N incorporation in InP and band gap bowing of $InN_xP_{1-x}$", J. Appl. Phys. 80 (3), pp. 1934–1936, Aug. 1, 1996.

* cited by examiner

LOW TEMPERATURE

HIGH TEMPERATURE

SEMICONDUCTOR LASER DEVICE, OPTICAL COMMUNICATION SYSTEM USING THE SAME, AND METHOD FOR PRODUCING COMPOUND SEMICONDUCTOR

BACKGROUND OF THE INVENTION

The present invention relates to a semiconductor laser device suitably used as a light source for optical communication and to an optical communication system using the same. The present invention also relates to technology for crystal-growing a compound semiconductor as a material for an active layer included in the semiconductor laser device and the optical communication system using the same.

A conventional semiconductor laser device as a light source for optical communication employs an InP substrate and InGaAsP mixed crystals as a material for the active layer thereof. This is because the InGaAsP mixed crystals have band gap energy on the bands of 1.3 μm and 1.55 μm, which are low transmission loss bands of an optical fiber.

A conventional semiconductor laser device for optical communication is illustrated in FIG. 10.

The semiconductor laser device shown in FIG. 10 includes: an n-type InP substrate 101; and a mesa-shaped multi-layer structure formed on the substrate 101. The mesa-shaped multi-layer structure includes: an n-type InGaAsP light confinement layer 102; an InGaAsP active layer 103; and a p-type InP cladding layer 104. A p-type InP current blocking layer 105 and an n-type InP current blocking layer 106 are buried in the regions interposing the mesa-shaped multi-layer structure therebetween. A p-type InP buried layer 107 and a p-type InGaAsP contact layer 108 are formed so as to cover these current blocking layers and the mesa-shaped multi-layer structure. An insulating film 109 having stripe-shaped openings is deposited over the p-type InGaAsP contact layer 108. An An/Zn electrode 110 and a Ti/Au electrode 111 are formed thereon. An Au/Sn electrode 112 is formed on the reverse surface of the substrate 101.

The InGaAsP/InP semiconductor laser device shown in FIG. 10 has a problem that the threshold current and the light emission efficiency thereof are variable to a large degree with respect to the variation in temperatures. Thus, various measures to keep the temperature of the semiconductor laser device constant, e.g., using a Peltier device, have been taken. However, the price of a laser module is raised partly because of such measures.

A very small band offset Δc on the conduction band is presumably one of the reasons why the characteristics of an InGaAsP/InP semiconductor laser device are variable to a large extent with respect to the variation in temperatures. This phenomenon will be described with reference to FIGS. 11A through 11C.

FIGS. 11A and 11B illustrate cases where an active layer has a quantum well structure including barrier layers and a well layer sandwiched therebetween. If ΔEc between the barrier layers and the well layer is as small as about 100 meV and if the temperature is low, then a sufficiently large number of electrons are confined within the well layer functioning as a light-emitting region as shown in FIG. 11A. However, if the temperature rises, then the electrons are likely to overflow from the well layer owing to the thermal energy applied and cease to contribute to the emission of light. Thus, the threshold current thereof increases and the slope efficiency declines shown in FIG. 11C.

As described above, ΔEc of the InGaAsP/InP semiconductor laser device is about 100 meV, which is much smaller than that of an AlGaAs/GaAs semiconductor laser device in the range from about 200 to about 300 meV.

In view of the above-described problems, the present invention was made in order to accomplish the objects of (1) providing a semiconductor laser device having low threshold current and exhibiting high slope efficiency over a wide temperature range and an optical communication system using the same, and (2) providing a method for producing an $InN_xAs_yP_{1-x-y}$ (where 0<x<1 and 0≦y<1) mixed crystal having excellent crystallinity suitable for the active layer of the semiconductor laser device.

SUMMARY OF THE INVENTION

In order to accomplish the above-described object, according to the present invention, an $InN_xAs_yP_{1-x-y}$ (where 0<x<1 and 0≦y<1) layer that is lattice-matched with a GaAs substrate, a GaP substrate or an Si substrate is used as the active layer, thereby realizing a semiconductor laser device oscillating on a wavelength band suitable for optical communication and having ΔEc of 200 meV or more.

A semiconductor laser device according to the present invention includes a GaAs substrate and a multi-layer structure formed on the GaAs substrate. The multi-layer structure includes an active layer for emitting light. The active layer includes an $InN_xAs_yP_{1-x-y}$ (where 0<x<1 and 0≦y<1) layer that is lattice-matched with the GaAs substrate.

By employing such a structure, a semiconductor laser device for long-distance optical communications (band gap energy is on the band from 1.1 to 1.6 μm) is realized by using a GaAs substrate. This is because the band gap energy of the $InN_xAs_yP_{1-x-y}$ (where 0<x<1 and 0≦y<1) layer that is lattice-matched with the GaAs substrate decreases owing to the bowing effect to be an optimum value for laser oscillation on the band from 1.1 to 1.6 μm. In addition, since the decrease in the conduction band level of the $InN_xAs_yP_{1-x-y}$ (where 0<x<1 and 0≦y<1) layer owing to the bowing effect is more remarkable than the decrease in the valence band level thereof, ΔEc can be increased to 200 meV or more in the multi-layer structure. Thus, even when the energy of the carriers increases because of the rise in temperature and/or temperature of the semiconductor laser device itself, the increase in number of carriers overflowing from the active layer can be suppressed. Therefore, the semiconductor laser device can show excellent performance in terms of temperature characteristics.

In one embodiment, the active layer preferably has a quantum well structure including at least one well layer and at least two barrier layers, and the well layer is preferably an $InN_xAs_yP_{1-x-y}$ (where 0<x<1 and 0≦y<1) layer.

In such an embodiment, the carriers in the well layer behave as quantum mechanical wave propagation. As a result, laser oscillation is realized by injecting a smaller amount of current.

In another embodiment, the barrier layers may be made of a material selected from the group consisting of AlGaInP, AlGaAs, GaAs, InGaAsP and InGaP.

In still another embodiment, the multi-layer structure may further include a first cladding layer, which has the same conductivity type as that of the substrate and is located below the active layer and a second cladding layer and a contact layer, which have a different conductivity type from that of the substrate and are located above the active layer. And an electrode may be disposed on the contact layer to be in contact with each other in a stripe region.

In such an embodiment, the injected current is confined to the stripe region. As a result, the carriers can be confined transversally.

In still another embodiment, a portion of the multi-layer structure, including the second cladding layer and the contact layer having the different conductivity type from that of the substrate, may be formed in a ridge shape.

In such an embodiment, the effective refractive index varies in a transverse direction in the ridge portion and the regions sandwiching the ridge portion. As a result, light can be confined transversally.

In still another embodiment, the multi-layer structure may further include: a first cladding layer, which has the same conductivity type as that of the substrate and is located below the active layer; and a second cladding layer, which has a different conductivity type from that of the substrate and is located above the active layer. The second cladding layer having the different conductivity type from that of the substrate may have a ridge-shaped portion. A current blocking layer having the same conductivity type as that of the substrate may be disposed to sandwich the ridge-shaped portion therebetween. And a buried layer having the different conductivity type from that of the substrate may be disposed on the current blocking layer.

In such an embodiment, carriers and light can be confined, and the reactive current can be reduced thanks to the function of the current blocking layer.

In still another embodiment, the cladding layers may be made of a material selected from the group consisting of GaAs, AlGaAs, InGaP and InGaAsP.

In still another embodiment, the cladding layers, the current blocking layer and the buried layer may be made of a material selected from the group consisting of GaAs, AlGaAs, InGaP and InGaAsP.

In still another embodiment, the multi-layer structure may further include: a first cladding layer, which has the same conductivity type as that of the substrate and is located below the active layer; a second cladding layer, which has a different conductivity type from that of the substrate and is located above the active layer; a current blocking layer, which has the same conductivity type as that of the substrate and is disposed above the second cladding layer having the different conductivity type from that of the substrate; and a buried layer, which has the different conductivity type from that of the substrate and is disposed above the current blocking layer. A part of the buried layer may be in contact with the second cladding layer having the different conductivity type from that of the substrate in a stripe region.

In such an embodiment, carriers and light can be confined, and the reactive current can be reduced thanks to the function of the current blocking layer.

In still another embodiment, the cladding layers, the current blocking layer and the buried layer may be made of a material selected from the group consisting of GaAs, AlGaAs, InGaP and InGaAsP.

In still another embodiment, the multi-layer structure may further include: a first cladding layer, which has the same conductivity type as that of the substrate and is located below the active layer; and a second cladding layer and a contact layer, which have a different conductivity type from that of the substrate and are located above the active layer. A part of the GaAs substrate and a portion including the cladding layers and the active layer may be formed to have a mesa shape. Both side regions of the mesa may be filled in with a first current blocking layer having the different conductivity type from that of the substrate and a second current blocking layer having the same conductivity type as that of the substrate. A buried layer having the different conductivity type from that of the substrate may be disposed over the second current blocking layer.

In such an embodiment, two current blocking layers having mutually different conductivity types confine the current to be injected into the mesa, thereby efficiently confining carriers and light and reducing the reactive current.

In still another embodiment, the cladding layers, the current blocking layer and the buried layer may be made of a material selected from the group consisting of GaAs, AlGaAs, InGaP and InGaAsP.

In still another embodiment, the multi-layer structure may further include: a semiconductor multi-layer mirror, which has the same conductivity type as that of the substrate and is located below the active layer; and a semiconductor multi-layer mirror, which has a different conductivity type from that of the substrate and is located above the active layer. The pair of semiconductor multi-layer mirrors may constitute a vertical laser cavity. And laser light generated inside the laser cavity may be emitted in a direction vertical to the substrate.

By employing such a structure, a surface-emitting semiconductor laser device for emitting laser light on a wavelength band suitable for optical communication can be obtained.

In still another embodiment, at least one of the pair of semiconductor multi-layer mirrors may include an AlAs/GaAs multi-layer structure.

In such an embodiment, a multi-layer mirror having a high reflectivity can be grown on a GaAs substrate and therefore a high-performance surface-emitting laser device can be provided.

In still another embodiment, at least one of the pair of semiconductor multi-layer mirrors may include an AlGaAs/GaAs multi-layer structure.

Another semiconductor laser device according to the present invention includes a GaP substrate and a multi-layer structure formed on the GaP substrate. The multi-layer structure includes an active layer for emitting light. The active layer includes an $InN_xAs_yP_{1-x-y}$ (where $0<x<1$ and $0 \leq y<1$) layer that is lattice-matched with the GaP substrate.

By employing such a structure, a semiconductor laser device for long-distance optical communications (band gap energy is on the band from 1.1 to 1.6 μm) is realized by using a GaP substrate. This is because the band gap energy of the $InN_xAs_yP_{1-x-y}$ (where $0<x<1$ and $0 \leq y<1$) layer that is lattice-matched with the GaP substrate decreases owing to the bowing effect to be an optimum value for laser oscillation on the band from 1.1 to 1.61 μm. In addition, since the decrease in the conduction band level of the $InN_xAs_yP_{1-x-y}$ (where $0<x<1$ and $0 \leq y<1$) layer owing to the bowing effect is more remarkable than the decrease in the valence band level thereof, $\Delta Ec$ can be increased to 200 meV or more in the multi-layer structure. Since the lattice constant of GaP is smaller than that of GaAs, materials having even larger band gap energy can be used. If the $InN_xAs_yP_{1-x-y}$ (where $0<x<1$ and $0 \leq y<1$) layer is sandwiched between a pair of layers made of a material having larger band gap energy, then $\Delta Ec$ can be further increased.

In one embodiment, the active layer preferably has a quantum well structure including at least one well layer and at least two barrier layers, and the well layer is preferably an $InN_xAs_yP_{1-x-y}$ (where $0<x<1$ and $0 \leq y<1$) layer.

In such an embodiment, the carriers in the well layer behave as quantum mechanical wave propagation. As a result, laser oscillation is realized by injecting a smaller amount of current.

In another embodiment, the barrier layers may be made of $GaN_{x'}As_{y'}P_{1-x'-y'}$ (where $0<x'<1$ and $0 \leq y'<1$).

In still another embodiment, the multi-layer structure may further include: a first cladding layer, which has the same conductivity type as that of the substrate and is located below the active layer; and a second cladding layer and a contact layer, which have a different conductivity type from that of the substrate and are located above the active layer. And an electrode may be disposed on the contact layer to be in contact with each other in a stripe region.

In such an embodiment, the injected current is confined to the stripe region. As a result, the carriers can be confined transversally.

In still another embodiment, a portion of the multi-layer structure, including the second cladding layer and the contact layer having the different conductivity type from that of the substrate, may be formed in a ridge shape.

In such an embodiment, the effective refractive index varies in a transverse direction in the ridge portion and the regions sandwiching the ridge portion. As a result, light can be confined transversally.

In still another embodiment, the multi-layer structure may further include: a first cladding layer, which has the same conductivity type as that of the substrate and is located below the active layer; and a second cladding layer, which has a different conductivity type from that of the substrate and is located above the active layer. The second cladding layer having the different conductivity type from that of the substrate may have a ridge-shaped portion. A current blocking layer having the same conductivity type as that of the substrate may be disposed to sandwich the ridge-shaped portion therebetween. And a buried layer having the different conductivity type from that of the substrate may be disposed on the current blocking layer.

In such an embodiment, carriers and light can be confined, and the reactive current can be reduced thanks to the function of the current blocking layer.

In still another embodiment, the cladding layers may be made of GaP.

In still another embodiment, the cladding layers, the current blocking layer and the buried layer may be made of GaP.

In still another embodiment, the multi-layer structure may further include: a first cladding layer, which has the same conductivity type as that of the substrate and is located below the active layer; a second cladding layer, which has a different conductivity type from that of the substrate and is located above the active layer; a current blocking layer, which has the same conductivity type as that of the substrate and is disposed above the second cladding layer having the different conductivity type from that of the substrate; and a buried layer, which has the different conductivity type from that of the substrate and is disposed above the current blocking layer. A part of the buried layer may be in contact with the second cladding layer having the different conductivity type from that of the substrate in a stripe region.

In still another embodiment, the cladding layers, the current blocking layer and the buried layer may be made of GaP.

In still another embodiment, the multi-layer structure may further include: a first cladding layer, which has the same conductivity type as that of the substrate and is located below the active layer; and a second cladding layer and a contact layer, which have a different conductivity type from that of the substrate and are located above the active layer.

A part of the GaP substrate and a portion including the cladding layers and the active layer may be formed to have a mesa shape. Both side regions of the mesa may be filled in with a first current blocking layer having the different conductivity type from that of the substrate and a second current blocking layer having the same conductivity type as that of the substrate. And a buried layer having the different conductivity type from that of the substrate may be disposed over the second current blocking layer.

In such an embodiment, two current blocking layers having mutually different conductivity types confine the current to be injected into the mesa, thereby efficiently confining carriers and light and reducing the reactive current.

In still another embodiment, the cladding layers, the current blocking layers and the buried layer may be made of GaP.

A still another semiconductor laser device according to the present invention includes an Si substrate and a multi-layer structure formed on the Si substrate. The multi-layer structure includes an active layer for emitting light. The active layer includes an $InN_xAs_yP_{1-x-y}$ (where $0<x<1$ and $0 \leq y<1$) layer that is lattice-matched with the Si substrate.

By employing such a structure, a semiconductor laser device for long-distance optical communications (band gap energy is on the band from 1.1 to 1.6 $\mu$m) is realized by using an Si substrate. This is because the band gap energy of the $InN_xAs_yP_{1-x-y}$ (where $0<x<1$ and $0 \leq y<1$) layer that is lattice-matched with the Si substrate decreases owing to the bowing effect to be an optimum value for laser oscillation on the band from 1.1 to 1.6 $\mu$m. In addition, since the decrease in the conduction band level of the $InN_xAs_yP_{1-x-y}$ (where $0<x<1$ and $0 \leq y<1$) layer owing to the bowing effect is more remarkable than the decrease in the valence band level thereof, $\Delta Ec$ can be increased to 200 meV or more in the multi-layer structure. Thus, even when the energy of the carriers increases because of the rise in temperature and/or temperature of the semiconductor laser device itself, the increase in number of carriers overflowing from the active layer can be suppressed. Therefore, the semiconductor laser device can show excellent performance in terms of temperature characteristics.

In particular, since an Si substrate is used, a semiconductor laser device can be integrated with semiconductor integrated circuit components such as transistors on a single substrate.

In one embodiment, the active layer preferably has a quantum well structure including at least one well layer and at least two barrier layers. The well layer is preferably an $InN_xAs_yP_{1-x-y}$ (where $0<x<1$ and $0 \leq y<1$) layer.

In such an embodiment, the carriers in the well layer behave as quantum mechanical wave propagation. As a result, laser oscillation is realized by injecting a smaller amount of current.

It is noted that the band gap energy of the barrier layers should be smaller than that of the cladding layer.

The optical communication system of the present invention includes the semiconductor laser device having any of the above-described structures.

A still another semiconductor laser device according to the present invention includes a GaAs substrate and a multi-layer structure formed on the GaAs substrate. The multi-layer structure includes an active layer for emitting light. The active layer includes an $InN_xAs_yP_{1-x-y}$ (where $0<x<1$ and $0 \leq y<1$) layer. And a transistor for supplying the active layer with current is integrated on the GaAs substrate.

A still another semiconductor laser device according to the present invention includes an Si substrate and a multi-layer structure formed on the Si substrate. The multi-layer structure includes an active layer for emitting light. The active layer includes an $InN_xAs_yP_{1-x-y}$ (where $0<x<1$ and $0 \leq y<1$) layer. And a transistor for supplying the active layer with current is integrated on the Si substrate.

A still another semiconductor laser device according to the present invention includes an Si substrate and a multi-layer structure formed on the Si substrate. The multi-layer structure includes an active layer for emitting light. The active layer includes an $InN_xAs_yP_{1-x-y}$ (where $0<x<1$ and $0 \leq y<1$) layer. And a recessed portion for supporting an optical fiber receiving laser light emitted from the active layer is formed in the Si substrate.

In one embodiment, at least part of the optical fiber may be supported by the recessed portion of the Si substrate.

In another embodiment, a transistor for supplying the active layer with current is preferably integrated on the Si substrate.

A method for fabricating a semiconductor laser device according to the present invention includes the steps of: forming a multi-layer structure including an $InN_xAs_yP_{1-x-y}$ (where $0<x<1$ and $0 \leq y<1$) layer on a semiconductor substrate; forming a laser cavity and a reflective surface thereof by patterning the multi-layer structure; and forming a transistor on the semiconductor substrate.

In one embodiment, the method may further include the step of forming a recessed portion for supporting an optical fiber receiving laser light emitted from the active layer in the semiconductor substrate.

In another embodiment, the method may further include the step of disposing at least part of the optical fiber in the recessed portion of the semiconductor substrate.

According to the method for producing a compound semiconductor of the present invention, $InN_xAs_yP_{1-x-y}$ (where $0<x<1$ and $0 \leq y<1$) is grown on a substrate, made of a semiconductor material selected from the group consisting of InP, GaAs, GaP and Si, by the use of a gas containing arsenic, a gas containing phosphorus, an organometallic gas containing indium and an organometallic gas containing nitrogen.

In one embodiment, the gas containing arsenic may be $ASH_3$ (arsine).

In another embodiment, the gas containing phosphorus may be $PH_3$ (phosphine).

In still another embodiment, the gas containing arsenic may be $As(C_4H_9)H_2$ (tertiarybutylarsine).

In still another embodiment, the gas containing phosphorus may be $P(C_4H_9)H_2$ (tertiarybutylphosphine).

In still another embodiment, the gas containing arsenic may be $As(C_4H_9)H_2$ (tertiarybutylarsine) and the gas containing phosphorus may be $P(C_4H_9)H_2$ (tertiarybutylphosphine).

In still another embodiment, the gas containing nitrogen may be an organometallic gas selected from the group consisting of $CH_3N_2H_3$ (monomethylhydrazine), $(CH_3)_2N_2H_2$ (dimethylhydrazine) and t-$C_4H_9N_2H_3$ (tertiarybutylhydrazine) gases.

In still another embodiment, an inert gas having a molecular weight larger than the molecular weight of hydrogen may be used as a carrier gas.

In still another embodiment, nitrogen may be used as a carrier gas.

In still another embodiment, argon may be used as a carrier gas.

BRIEF DESCRIPTION OF THE DRAWINGS

FIG. 11A is band gap energy diagram during the low-temperature operation thereof; FIG. 11B is band gap energy diagram during the high-temperature operation thereof; and FIG. 11C is a graph illustrating the temperature dependence of the current-light characteristics.

DESCRIPTION OF THE PREFERRED EMBODIMENTS

Figure 9A:
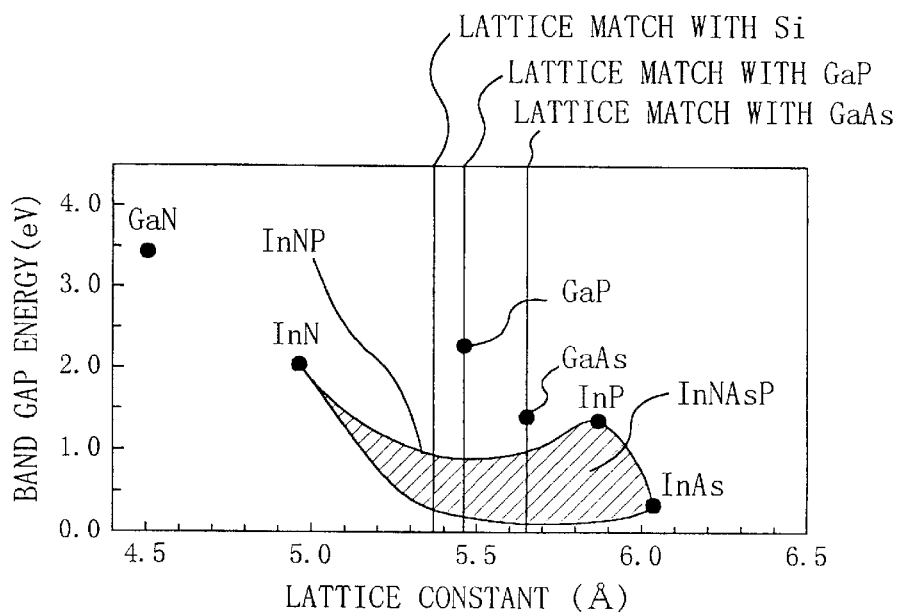
FIG. 9A is a graph illustrating the relationships between the band gap energy of semiconductor materials used for the active layer of the semiconductor laser device according to the present invention and the lattice constants thereof.

FIG. 9A illustrates the relationships between the band gap energy of Group III–V compound semiconductors and lattice constants thereof. The lattice constant of $InN_xP_{1-x}$ (where 0<x<1, hereinafter simply referred to as "InNP"), which is a mixed crystal of InP and InN, can be matched with that of GaAs, GaP or Si by setting the mole fractions of N (nitrogen) and P (phosphorus) included therein at respective appropriate values.

However, if an increasing amount of nitrogen (N) is added to InP, the band gap of the resulting tertiary mixed crystal is expected to linearly increase to be closer to the band gap energy of InNP. Thus, in such a case, the band gap energy of the mixed crystal has conventionally been regarded as becoming more and more distant from the band gap energy suitable for optical communication (the oscillation wavelength is on the band from 1.1 to 1.6 $\mu$m). Accordingly, when InGaAsP or InPAs is used as a material for the active layer of a semiconductor laser device, an InP substrate is always used, and one has never run a risk of using a substrate made of a material having a smaller lattice constant than that of InP.

The present inventors found that if nitrogen (N) is gradually added to InP or if phosphorus (P) is added little by little to InN, then the resulting band gap energy decreases as shown in FIG. 9A (this is the "bowing phenomenon"). Thus, even if N is added in such a manner as to match the lattice constant with that of GaAs, GaP or Si, the resulting band gap energy is smaller than those of InP and InN and is located on the band of 1.1 to 1.6 $\mu$m, which is used for optical communication.

Figure 9B:
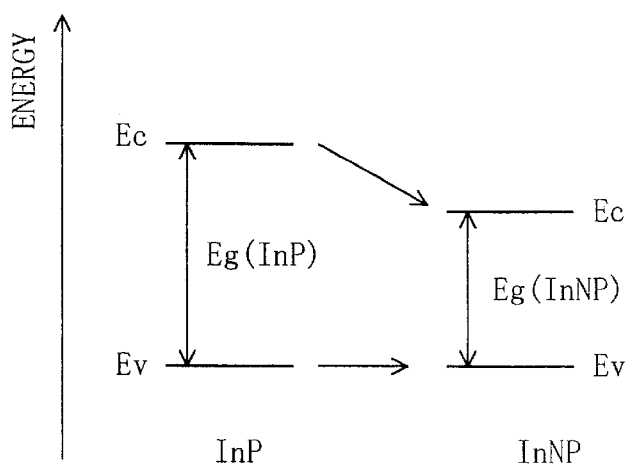
FIG. 9B is a diagram showing the band structures of InP and InNP.
Figure 10:
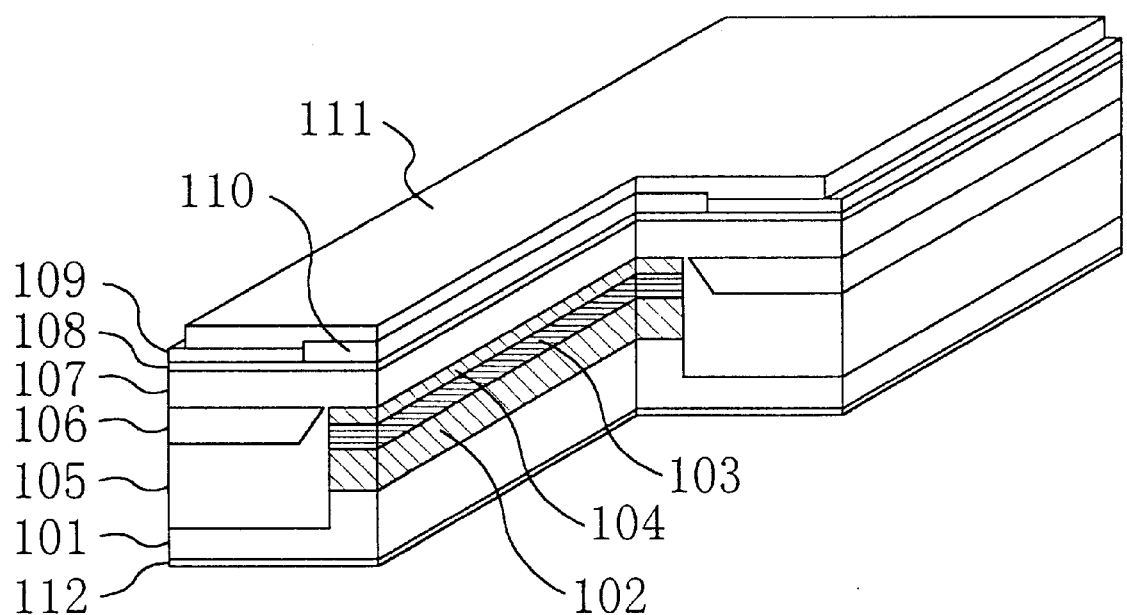
FIG. 10 is a partially sectional perspective view of a conventional semiconductor laser device.
Figure 11A:
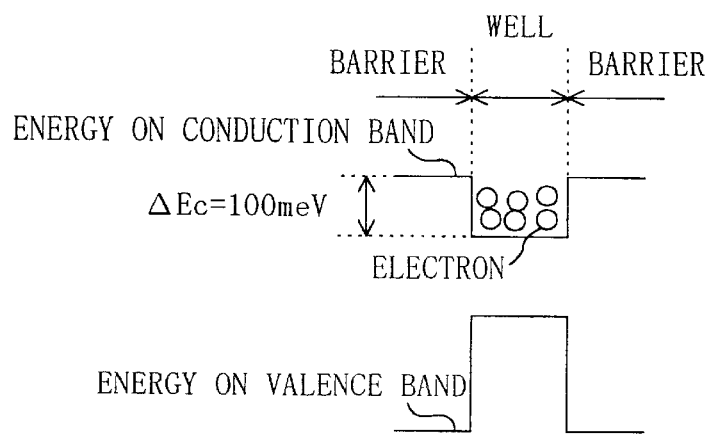
FIGS. 11A through 11C illustrate a problem of a conventional semiconductor laser device.
Figure 11B:
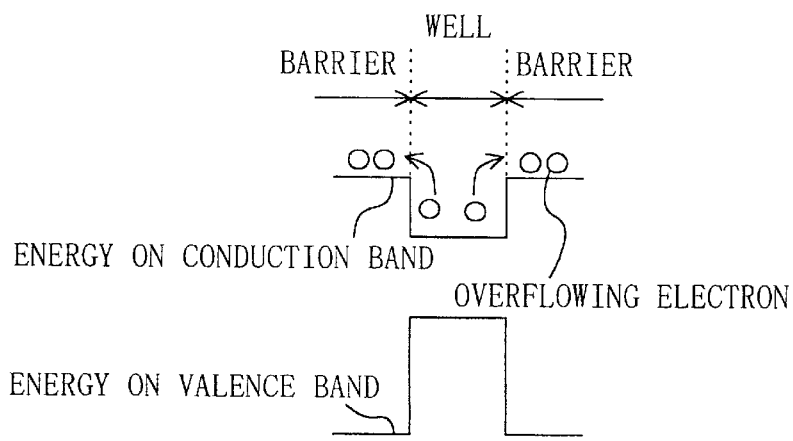
Figure 11C:
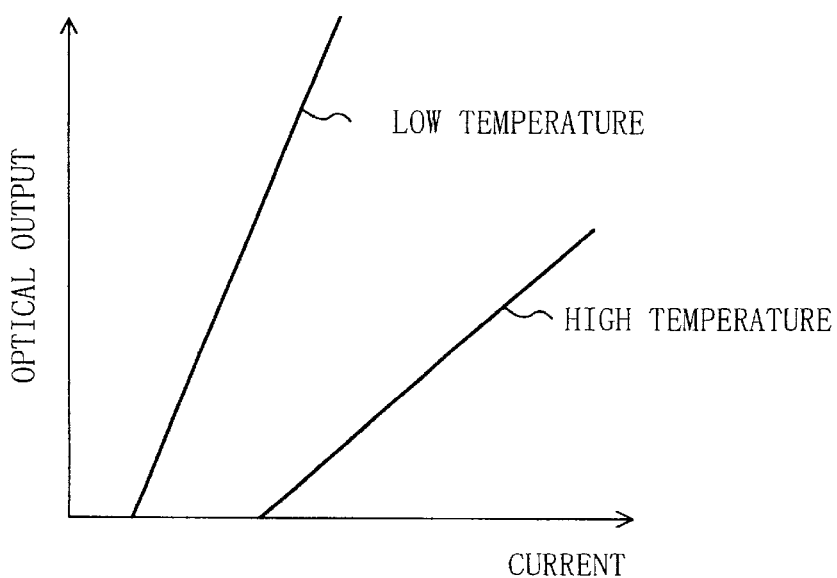

Since the bowing effect of the band gap energy, found by the present inventors, occur primarily on the conduction band, $\Delta$Ec becomes very large to exceed 200 meV. This phenomenon will be described with reference to FIG. 9B. FIG. 9B illustrates the band structures of InP and InNP. As shown in FIG. 9B, if InP has been turned into InNP by adding 70% or less of N, the band gap energy of InNP Eg(InNP) is smaller than the band gap energy of InP Eg(InP). The energy Ev on the valence band hardly changes before and after this addition, whereas the energy Ec on the conduction band decreases after the addition of N. If such an InNP layer is sandwiched between a pair of layers of GaAs, GaP or AlGaAs, then $\Delta$Ec as large as 200 meV or more is realized. In particular, if a GaAs substrate is used, then AlGaAs layers, which cannot be crystal-grown on an InP substrate, can be grown on the GaAs substrate, and these layers can be used as cladding layers and barrier layers. Consequently, it is possible to realize a structure more suitable for the confinement of carriers than a structure using an InP substrate.

It is noted that the lattice constant of $InN_xAs_yP_{1-x-y}$ (where 0<x<1 and 0<y<1, hereinafter simply referred to as "InNAsP"), which is a mixed crystal of InP, InN and InAs, can also be matched with that of GaAs, GaP or Si in the same way as InNP. The band gap energy thereof can also be adjusted to show values on the band of 1.1 to 1.6 $\mu$m. If the mole fractions of P, N and As are appropriately set for InNAsP, then the lattice constant and the band gap energy thereof can be controlled over a wider range than that of InNP.

In this specification, "InNP" and "InNAsP" will both be represented by $InN_xAs_yP_{1-x-y}$ (where 0<x<1 and 0$\leq$y<1).

Hereinafter, the preferred embodiments of the present invention will be described with reference to the accompanying drawings.

Embodiment 1

Figure 1A:
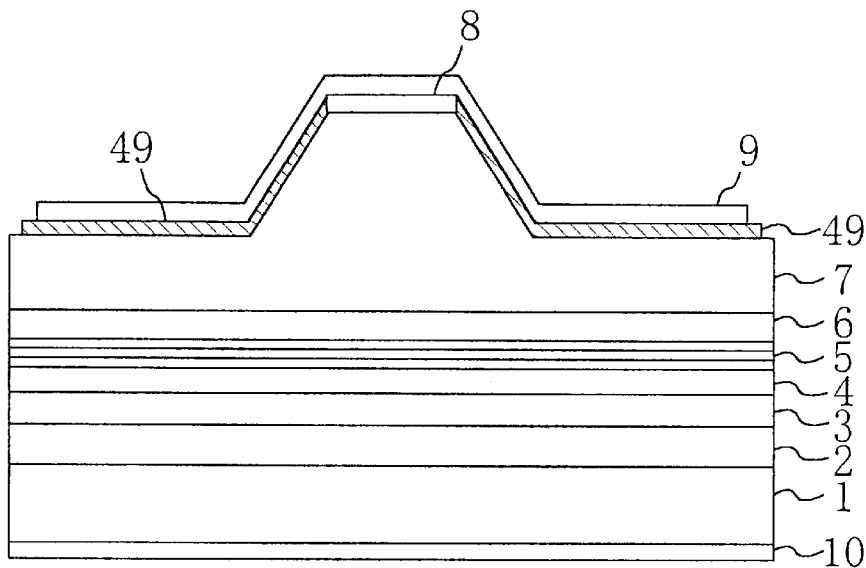
FIG. 1A is a front view illustrating a semiconductor laser device in the first embodiment of the present invention.

FIG. 1A is a front view of a semiconductor laser device in the first embodiment of the present invention. The oscillation wavelength of the semiconductor laser device is in the vicinity of 1.3 $\mu$m.

The semiconductor laser device includes an n-type GaAs substrate 1 and a multi-layer structure formed on the n-type GaAs substrate 1. The multi-layer structure includes: an n-type GaAs buffer layer 2 having a thickness of 1 $\mu$m; an n-type $Al_{0.5}Ga_{0.5}As$ cladding layer 3 having a thickness of 1.5 $\mu$m; an n-type GaAs light confinement layer 4 having a thickness of 100 nm; an active layer 5; a p-type GaAs light confinement layer 6 having a thickness of 100 nm; a p-type $Al_{0.5}Ga_{0.5}As$ cladding layer 7 having a thickness of 2.0 $\mu$m at the center portion; and a p-type GaAs contact layer 8 having a thickness of 1 $\mu$m, all of these layers being stacked in this order on the GaAs substrate 1. In this embodiment, parts of the cladding layer 7 are etched away, thereby forming a stripe-shaped ridge structure for adjusting the transverse mode of the laser light. An $SiO_2$ insulating film 49 is deposited over the multi-layer structure, i.e., on the p-type cladding layer 7, and a p-side electrode 9 is disposed on the layer 49. The p-side electrode 9 is in contact with the contact layer 8 through stripe-shaped openings formed in the $SiO_2$ insulating film 49. An n-side electrode 10 is formed on the reverse surface of the n-type GaAs substrate 1. face of the n-type GaAs substrate 1.

Figure 1B:
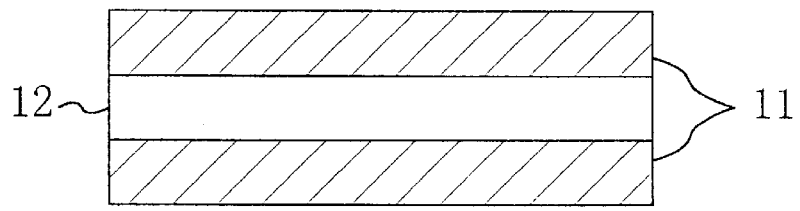
FIG. 1B is an enlarged view showing the structure of the active layer thereof.

FIG. 1B is an enlarged view of the active layer 5. The active layer 5 has a quantum well structure in which a pair of GaAs barrier layers 11 sandwich an InNAsP well layer 12 therebetween. The mole fractions and the thickness of the InNAsP well layer 12 are set such that the oscillation wavelength of the laser device is in the vicinity of 1.3 $\mu$m. A lattice distortion (strain) from −1.5% to +1.5% with respect to GaAs is applied to the InNAsP well layer 12.

By employing such a structure, the band offset $\Delta$Ec between the GaAs barrier layers 11 and the InNAsP well layer 12 on the conduction band can be set at 200 meV or more and the band offset $\Delta$Ev therebetween on the valence band can be set at 100 meV or less. Thus, even when the temperature rises, electrons can be confined sufficiently and the resulting characteristics are not deteriorated.

In this embodiment, the well layer 12 is made of InNAsP. Alternatively, the same effects can be attained if the well layer 12 is made of InNP. Though the number of the well layer 12 in the active layer 5 is one in this embodiment, the number may be two or more, i.e., a multiple quantum well structure may be employed.

In this embodiment, the barrier layers 11 and the light confinement layers 4 and 6 are made of GaAs. Alternatively, any of InGaAsP, InGaP, AlGaAs and AlGaInP may be used instead. Though the light confinement layers 4 and 6 are made of a single kind of material, each of these layers may be made of two or more kinds of materials having mutually different band gap energy values, which are selected from InGaAsP, InGaP, AlGaAs and AlGaInP. The cladding layers 3 and 7 are made of AlGaAs. Alternatively, any of InGaAsP, InGaP and AlGaInP that is lattice-matched with GaAs may be used instead.

Moreover, though the oscillation wavelength of the laser device in this embodiment is on the band of 1.3 $\mu$m, the wavelength may be on the band of 1.55 $\mu$m or on any other arbitrary band.

The laser device of this embodiment is a Fabry-Perot type laser device. Alternatively, the present invention is also applicable to a distributed feedback semiconductor laser device (DFB laser device) in which a diffraction grating is formed in the vicinity of the active layer (e.g., in a region of the substrate in the vicinity of the active layer).

Embodiment 2

Figure 2A:
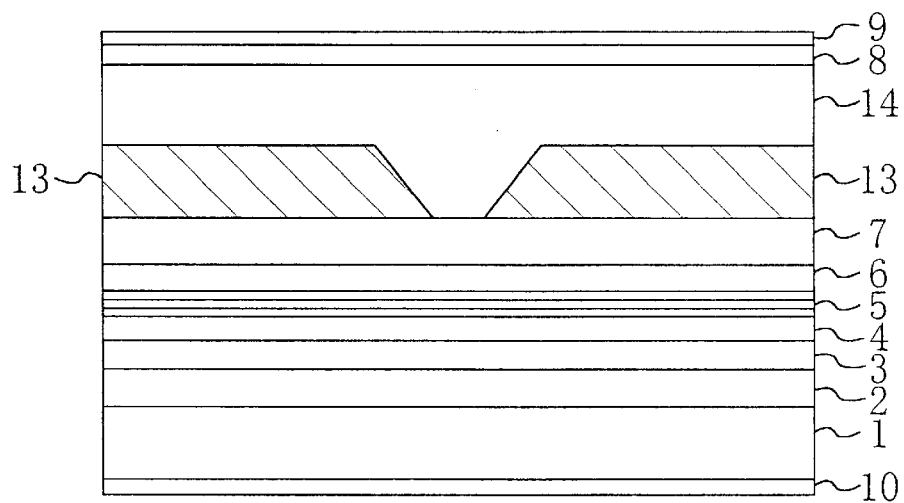
FIG. 2A is a front view illustrating a semiconductor laser device in the second embodiment of the present invention.

FIG. 2A is a front view of a semiconductor laser device in the second embodiment of the present invention. The oscillation wavelength of the semiconductor laser device is in the vicinity of 1.3 $\mu$m.

The semiconductor laser device includes an n-type GaAs substrate 1 and a multi-layer structure formed on the n-type GaAs substrate 1. The multi-layer structure includes: an n-type GaAs buffer layer 2 having a thickness of 1 $\mu$m; an n-type $Al_{0.5}Ga_{0.5}As$ cladding layer 3 having a thickness of 1.5 $\mu$m; an n-type GaAs light confinement layer 4 having a thickness of 100 nm; an active layer 5; a p-type GaAs light confinement layer 6 having a thickness of 100 nm; and a p-type $Al_{0.5}Ga_{0.5}As$ cladding layer 7 having a thickness of 0.15 $\mu$m, all of these layers being stacked in this order on the GaAs substrate 1. In this embodiment, an n-type $Al_{0.6}Ga_{0.4}As$ current blocking layer 13 is deposited on the p-type cladding layer 7. Part of the current blocking layer 13 is etched away at the center thereof, thereby forming stripe-shaped openings. A p-type $Al_{0.5}Ga_{0.5}As$ buried layer 14 having a thickness of 2.0 $\mu$m and a p-type GaAs contact layer 8 having a thickness of 1 $\mu$m are stacked over the current blocking layer 13. The buried layer 14 comes into contact with the cladding layer 7 at the center in the stripe-shaped region extending in the direction of the laser cavity. The current vertically flows through this region. The width of the stripe region is 2.54 $\mu$m. A p-side electrode 9 is in contact with the contact layer 8. An n-side electrode 10 is formed on the reverse surface of the n-type GaAs substrate 1.

Figure 2B:
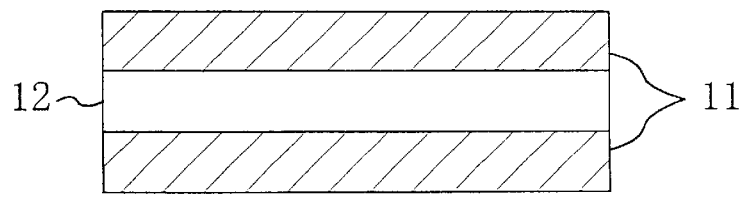
FIG. 2B is an enlarged view showing the structure of the active layer thereof.

FIG. 2B is an enlarged view of the active layer 5. The active layer 5 has a quantum well structure in which a pair of GaAs barrier layers 11 sandwich an InNAsP well layer 12 therebetween. The mole fractions and the thickness of the InNAsP well layer 12 are set such that the oscillation wavelength of the laser device is in the vicinity of 1.3 $\mu$m. A lattice distortion (strain) from −1.5% to +1.5% with respect to GaAs is applied to the InNAsP well layer 12.

By employing such a structure, the band offset ΔEc between the GaAs barrier layers 11 and the InNAsP well layer 12 on the conduction band can be set at 200 meV or more and the band offset ΔEv therebetween on the valence band can be set at 100 meV or less. Thus, even when the temperature rises, electrons can be confined sufficiently and the resulting characteristics of the device are not deteriorated.

Moreover, since the laser device of this embodiment has a real refractive index type waveguide structure, the laser device can be oscillated stably in a single transverse mode. In this embodiment, the well layer 12 is made of InNAsP. Alternatively, the same effects can be attained if the well layer 12 is made of InNP.

Though the number of the well layer 12 is one in this embodiment, the number may be two or more. In this embodiment, the barrier layers 11 and the light confinement layers 4 and 6 are made of GaAs. Alternatively, any of InGaAsP, InGaP, AlGaAs and AlGaInP may be used instead.

Though the light confinement layers 4 and 6 are made of a single kind of material, each of these layers may be made of two or more kinds of materials having mutually different band gap energy values, which are selected from InGaAsP, InGaP, AlGaAs and AlGaInP. The cladding layers 3 and 7 are made of AlGaAs. Alternatively, any of InGaAsP, InGaP and AlGaInP that is lattice-matched with GaAs may be used instead.

Moreover, though the oscillation wavelength of the laser device in this embodiment is on the band of 1.3 $\mu$m, the wavelength may be on the band of 1.55 $\mu$m or on any other arbitrary band.

The laser device of this embodiment is a Fabry-Perot type laser device. Alternatively, the present invention is also applicable to a distributed feedback semiconductor laser device (DFB laser device) in which a diffraction grating is formed in the vicinity of the active layer (e.g., in a region of the substrate in the vicinity of the active layer).

Embodiment 3

Figure 3A:
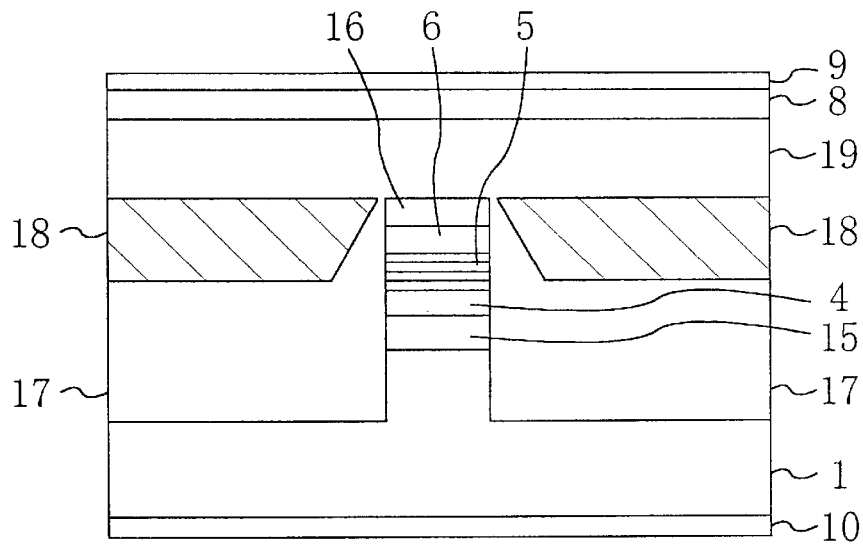
FIG. 3A is a front view illustrating a semiconductor laser device in the third embodiment of the present invention.

FIG. 3A is a front view of a semiconductor laser device in the third embodiment of the present invention. The oscillation wavelength of the semiconductor laser device is in the vicinity of 1.3 $\mu$m.

The semiconductor laser device includes an n-type GaAs substrate 1 and a multi-layer structure formed on the n-type GaAs substrate 1. The multi-layer structure includes: an n-type GaAs buffer layer (not shown) having a thickness of 1 $\mu$m; an n-type $In_{0.5}Ga_{0.5}P$ cladding layer 15 having a thickness; an n-type $In_{0.5}Ga_{0.5}P$ cladding layer 15 having a thickness of 1.5 $\mu$m; an n-type GaAs light confinement layer 4 having a thickness of 100 nm; an active layer 5; a p-type GaAs light confinement layer 6 having a thickness of 100 nm; and a p-type $In_{0.5}Ga_{0.5}P$ cladding layer 16 having a thickness of 0.2 $\mu$m, all of these layers being stacked in this order on the n-type GaAs substrate 1. The multi-layer film including the n-type cladding layer 15, the n-type light confinement layer 4, the active layer 5, the p-type light confinement layer 6 and the p-type cladding layer 16 is etched, thereby forming a stripe-shaped mesa extending in the laser cavity direction.

A p-type $In_{0.5}Ga_{0.5}P$ current blocking layer 17 and an n-type $In_{0.5}Ga_{0.5}P$ current blocking layer 18 are stacked on both sides of the mesa. A p-type $In_{0.5}Ga_{0.5}P$ buried layer 19 having a thickness of 2.0 $\mu$m and a p-type GaAs contact layer 8 having a thickness of 1 $\mu$m are stacked over the current blocking layer 18 and the p-type cladding layer 16. Current vertically flows through this mesa. The width of the mesa is 1.5 $\mu$m. A p-side electrode 9 is in contact with the contact layer 8. An n-side electrode 10 is formed on the reverse surface of the n-type GaAs substrate 1.

Figure 3B:
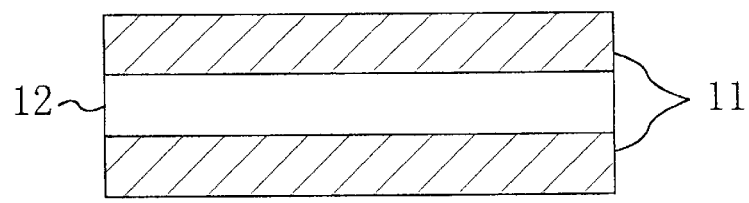
FIG. 3B is an enlarged view showing the structure of the active layer thereof.

FIG. 3B is an enlarged view of the active layer 5. The active layer 5 includes a pair of GaAs barrier layers 11 and an InNAsP well layer 12. The mole fractions and the thickness of the InNAsP well layer 12 are set such that the oscillation wavelength of the laser device is in the vicinity of 1.3 μm. A lattice distortion (strain) from −1.5% to +1.5% with respect to GaAs is applied to the InNAsP well layer 12.

By employing such a structure, the band offset ΔEc between the GaAs barrier layers 11 and the InNAsP well layer 12 on the conduction band can be set at 200 meV or more and the band offset ΔEv therebetween on the valence band can be set at 100 meV or less. Thus, even when the temperature rises, electrons can be confined sufficiently and the resulting characteristics of the laser device are not deteriorated. Moreover, since the laser device of this embodiment has a real refractive index type waveguide structure, the laser device can be oscillated stably in a single transverse mode. In addition, since the current flows only through the active layer 5 in the mesa, current components not contributing to the oscillation can be considerably reduced and current characteristics having a low threshold value are realized.

In this embodiment, the well layer 12 is made of InNAsP. Alternatively, the same effects can be attained if the well layer 12 is made of InNP. Though the number of the well layer 12 is one in this embodiment, the number may be two or more. In this embodiment, the barrier layers 11 and the light confinement layers 4 and 6 are made of GaAs. Alternatively, InGaAsP may be used instead. Though the light confinement layers 4 and 6 are made of a single kind of material, each of these layers may be made of InGaAsP with two or more sets of mole fractions. The cladding layers 15 and 16 are made of InGaP. Alternatively, InGaAsP that is lattice-matched with GaAs and has larger band gap energy than that of the barrier layers 11 may be used instead.

Moreover, though the oscillation wavelength of the laser device in this embodiment is on the band of 1.3 μm, the wavelength may be on the band of 1.55 μm or on any other arbitrary band. The laser device of this embodiment is a Fabry-Perot type laser device. Alternatively, the present invention is also applicable to a distributed feedback semiconductor laser device (DFB laser device) in which a diffraction grating is formed in the vicinity of the active layer (e.g., in a region of the substrate in the vicinity of the active layer).

Embodiment 4

Figure 4A:
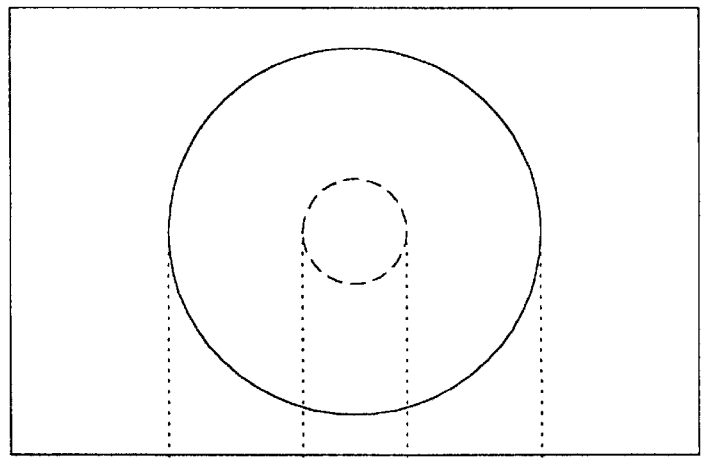
FIG. 4A is a plan view illustrating a semiconductor laser device (vertical-laser cavity-type surface-emitting laser device) in the fourth embodiment of the present invention.
Figure 4B:
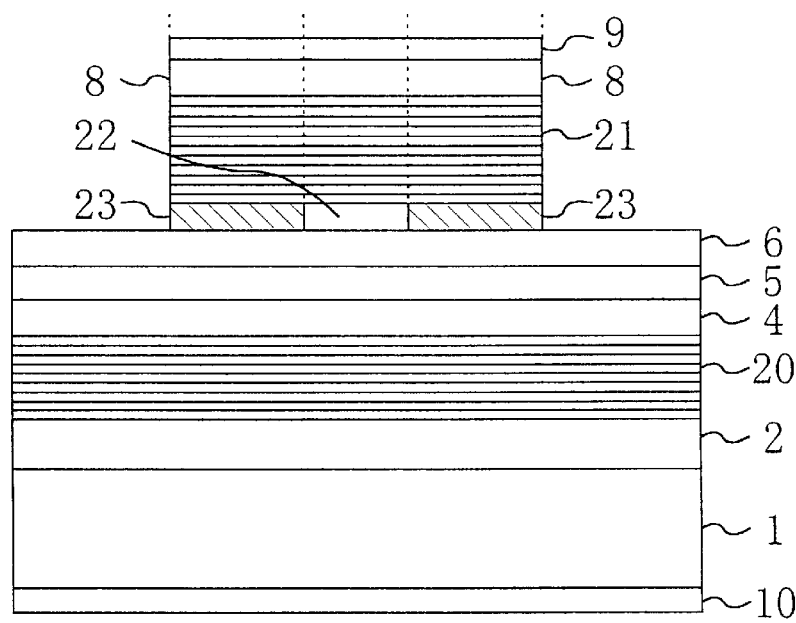
FIG. 4B is a cross-sectional view thereof.

FIG. 4A is a plan view of a semiconductor laser device (vertical-laser cavity-type surface-emitting laser device) in the fourth embodiment of the present invention, and FIG. 4B is a cross-sectional view of the center portion thereof. The oscillation wavelength of the semiconductor laser device is in the vicinity of 1.3 μm.

The semiconductor laser device includes an n-type GaAs substrate 1 and a multi-layer structure formed on the n-type GaAs substrate 1. The multi-layer structure includes: an n-type GaAs buffer layer 2 having a thickness of 1 μm; an n-type semiconductor multi-layer reflective mirror 20; an n-type GaAs light confinement layer 4 having a thickness of 100 nm; an active layer 5; a p-type GaAs light confinement layer 6 having a thickness of 100 nm; a p-type semiconductor multi-layer reflective mirror 21; and a p-type GaAs contact layer 8 having a thickness of 1 μm, all of these layers being stacked in this order on the n-type GaAs substrate 1.

The p-type semiconductor multi-layer reflective mirror 21 and the p-type GaAs contact layer 8 have been etched to constitute a circular mesa, the diameter of which is 50 μm.

A current confinement structure including an AlAs region 22 and an aluminum oxide region 23 is formed between the p-type GaAs light confinement layer 6 and the p-type semiconductor multi-layer reflective mirror 21. The current confinement structure is divided into the central AlAs region 22 having a diameter of 5 μm and the aluminum oxide region 23 surrounding the AlAs region 22 and having electrically insulating properties. Current flows only through the AlAs region 22 so as to be injected into the active layer 5. The aluminum oxide region 23 is formed by selectively oxidizing the peripheral region of the AlAs layer.

The n-type semiconductor multi-layer reflective mirror 20 has a structure including alternately stacked 28 AlAs layers and 28 GaAs layers, while the p-type semiconductor multi-layer reflective mirror 21 has a structure including alternately stacked 30 $Al_{0.67}Ga_{0.33}As$ layers and 30 GaAs layers. The thickness of each layer is 1.3 μm to maximize the overall reflectivity thereof.

A p-side electrode 9 is in contact with the contact layer 8. An n-side electrode 10 is formed on the reverse surface of the n-type GaAs substrate 1. However, in this embodiment, the n-side electrode 10 is not formed in a center region, corresponding to the bottom of the circular mesa, of the reverse surface of the n-type GaAs substrate 1. By utilizing such a structure, the laser light can be emitted through the n-type GaAs substrate 1.

Figure 4C:
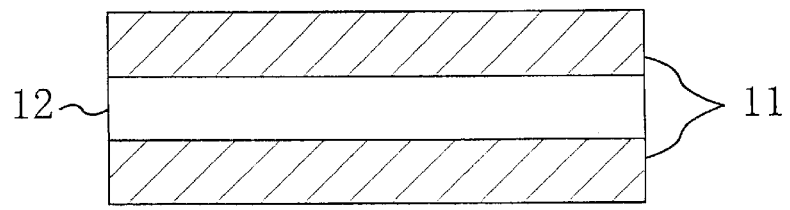
FIG. 4C is an enlarged view showing the structure of the active layer thereof.

FIG. 4C is an enlarged view of the active layer 5. The active layer 5 includes a pair of GaAs barrier layers 11 and an InNAsP well layer 12. The mole fractions and the thickness of the InNAsP well layer 12 are set such that the oscillation wavelength of the laser device is in the vicinity of 1.3 μm. A lattice distortion (strain) from −1.5% to +1.5% with respect to GaAs is applied to the InNAsP well layer 12.

By employing such a structure, the band offset ΔEc between the GaAs barrier layers 11 and the InNAsP well layer 12 on the conduction band can be set at 200 meV or more and the band offset ΔEv therebetween on the valence band can be set at 100 meV or less. Thus, even when the temperature rises, electrons can be confined sufficiently and the resulting characteristics of the laser device are not deteriorated. Furthermore, since an Al(Ga)As/GaAs multi-layer film, enabling very high reflectivity, can be used as the semiconductor multi-layer reflective mirror, characteristics having a low threshold value are realized. If an InP substrate is used, as has conventionally been done, the Al(Ga)As/GaAs multi-layer film cannot be epitaxially grown on the InP substrate, and it has been necessary to attach the Al(Ga)As/GaAs multi-layer mirror to the InP substrate. However, in this embodiment, since a GaAs substrate is used, a surface-emitting semiconductor laser device with a multi-layer mirror having high reflectivity can be provided with lower costs.

In this embodiment, the well layer 12 is made of InNAsP. Alternatively, the same effects can be attained if the well layer 12 is made of InNP. Though the number of the well layer 12 is one in this embodiment, the number may be two or more. In this embodiment, the barrier layers 11 and the light confinement layers 4 and 6 are made of GaAs. Alternatively, any of InGaAsP, InGaP, AlGaAs and AlGaInP may be used instead. Though the light confinement layers 4 and 6 are made of a single kind of material, each of these layers may be made of two or more kinds of materials having mutually different band gap energy values, which are selected from InGaAsP, InGaP, AlGaAs and AlGaInP.

Moreover, though the oscillation wavelength of the laser device in this embodiment is on the band of 1.3 μm, the wavelength may be on the band of 1.55 μm or on any other arbitrary band.

Embodiment 5

Figure 5A:
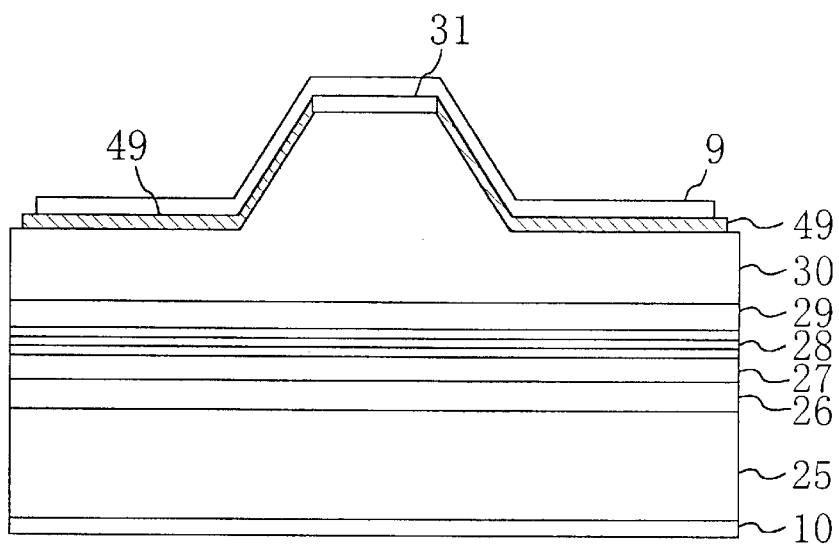
FIG. 5A is a front view illustrating a semiconductor laser device in the fifth embodiment of the present invention.

FIG. 5A is a front view of a semiconductor laser device in the fifth embodiment of the present invention. The oscillation wavelength of the semiconductor laser device is in the vicinity of 1.3 μm.

The semiconductor laser device includes an n-type GaP substrate 25 and a multi-layer structure formed on the n-type GaP substrate 25. The multi-layer structure includes: an n-type GaP cladding layer 26 having a thickness of 1.5 μm; an n-type GaN$_{x'}$As$_{y'}$P$_{1-x'-y'}$ (where 0<x'<1 and 0≦y'<1) (hereinafter, simply referred to as "GaNAsP") light confinement layer 27; an active layer 28; a p-type GaNAsP light confinement layer 29; a p-type GaP cladding layer 30 having a thickness of 2.0 μm at the center portion; and a p-type GaP contact layer 31 having a thickness of 1 μm, all of these layers being stacked in this order on the n-type GaP substrate 25.

In this embodiment, parts of the cladding layer 30 are etched away, thereby forming a stripe-shaped ridge structure for adjusting the transverse mode of the laser light. An SiO$_2$ insulating film 49 is deposited over the multi-layer structure, i.e., on the p-type cladding layer 30, and a p-side electrode 9 is disposed on the layer 49. The p-side electrode 9 is in contact with the contact layer 31 through stripe-shaped openings formed in the SiO$_2$ insulating film 49. An n-side electrode 10 is formed on the reverse surface of the n-type GaP substrate 25.

Figure 5B:
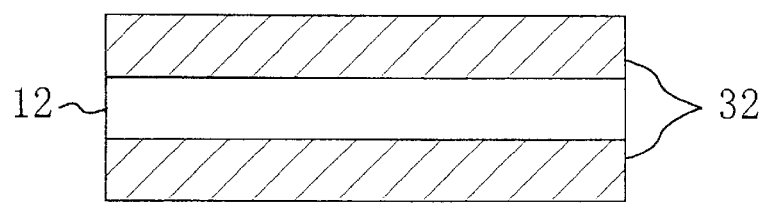
FIG. 5B is an enlarged view showing the structure of the active layer thereof.

FIG. 5B is an enlarged view of the active layer 28. The active layer 28 includes a pair of GaNAsP barrier layers 32 and an InNAsP well layer 12. The mole fractions and the thickness of the InNAsP well layer 12 are set such that the oscillation wavelength of the laser device is in the vicinity of 1.3 μm. A lattice distortion (strain) from −1.5% to +1.5% with respect to GaP is applied to the InNAsP well layer 12.

By employing such a structure, the band offset ΔEc between the GaNAsP barrier layers 32 and the InNAsP well layer 12 on the conduction band can be set at 500 meV or more, which is larger than that of a structure using a GaAs substrate. Thus, even when the temperature rises, electrons can be confined sufficiently and the resulting characteristics of the laser device are not deteriorated.

In this embodiment, the well layer 12 is made of InNAsP. Alternatively, the same effects can be attained if the well layer 12 is made of InNP. Though the number of the well layer 12 is one in this embodiment, the number may be two or more. Though the light confinement layers 27 and 29 are made of a single kind of material, each of these layers may be made of GaNAsP with two or more sets of mole fractions.

Moreover, though the oscillation wavelength of the laser device in this embodiment is on the band of 1.3 μm, the wavelength may be on the band of 1.55 μm or on any other arbitrary band. The laser device of this embodiment is a Fabry-Perot type laser device. Alternatively, the present invention is also applicable to a distributed feedback semiconductor laser device (DFB laser device) in which a diffraction grating is formed in the vicinity of the active layer (e.g., in a region of the substrate in the vicinity of the active layer).

Embodiment 6

Figure 6A:
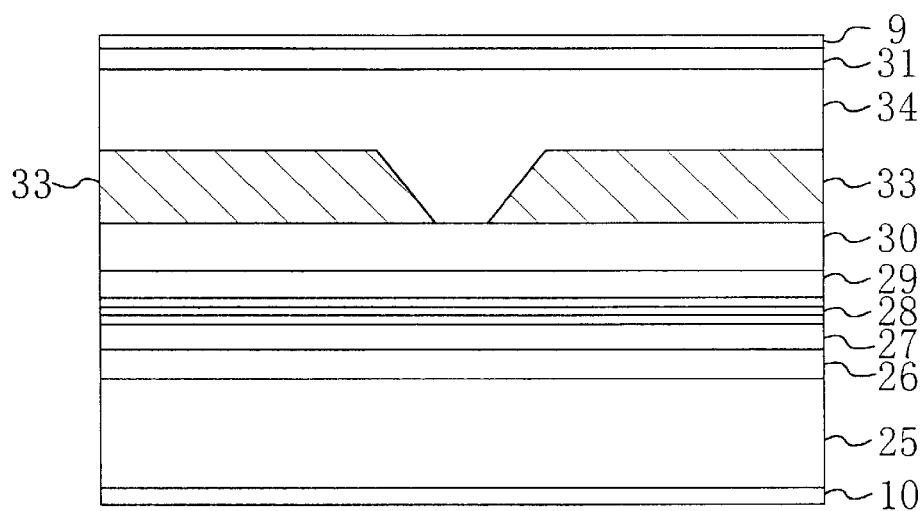
FIG. 6A is a front view illustrating a semiconductor laser device in the sixth embodiment of the present invention.

FIG. 6A is a front view of a semiconductor laser device in the sixth embodiment of the present invention. The oscillation wavelength of the semiconductor laser device is in the vicinity of 1.3 μm.

The semiconductor laser device includes an n-type GaP substrate 25 and a multi-layer structure formed on the n-type GaP substrate 25. The multi-layer structure includes: an n-type GaP cladding layer 26 having a thickness of 1.5 μm; an n-type GaNAsP light confinement layer 27; an active layer 28; a p-type GaNAsP light confinement layer 29; and a p-type GaP cladding layer 30 having a thickness of 0.15 μm, all of these layers being stacked in this order on the GaP substrate 25. In this embodiment, an n-type GaP current blocking layer 33 is deposited on the p-type cladding layer 30. Part of the current blocking layer 33 is etched away at the center thereof. A p-type GaP buried layer 34 having a thickness of 2.0 μm and a p-type GaP contact layer 31 having a thickness of 1 μm are stacked over the current blocking layer 33. The buried layer 34 comes into direct contact with the cladding layer 30 at the center in the stripe-shaped region extending in the direction of the laser cavity. Current vertically flows through this region. The width of the stripe region is 2.5 μm. A p-side electrode 9 is in contact with the contact layer 31. An n-side electrode 10 is formed on the reverse surface of the n-type GaP substrate 25.

Figure 6B:
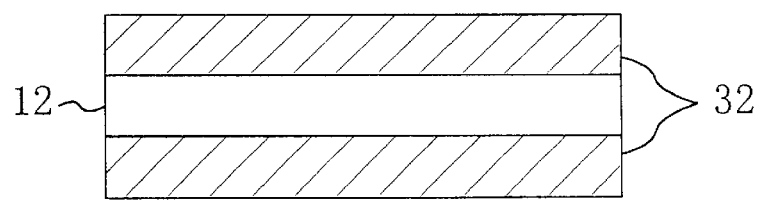
FIG. 6B is an enlarged view showing the structure of the active layer thereof.

FIG. 6B is an enlarged view of the active layer 28. The active layer 28 includes a pair of GaNAsP barrier layers 32 and an InNAsP well layer 12. The mole fractions and the thickness of the InNAsP well layer 12 are set such that the oscillation wavelength of the laser device is in the vicinity of 1.3 μm. A lattice distortion (strain) from −1.5% to +1.5% with respect to GaP is applied to the InNAsP well layer 12.

By employing such a structure, the band offset ΔEc between the GaNAsP barrier layers 32 and the InNAsP well layer 12 on the conduction band can be set at 500 meV or more, which is larger than that of a structure using a GaAs substrate. Thus, even when the temperature rises, electrons can be confined sufficiently and the resulting characteristics of the laser device are not deteriorated. Moreover, since the current can be confined effectively, the threshold current can be reduced.

In this embodiment, the well layer 12 is made of InNAsP. Alternatively, the same effects can be attained if the well layer 12 is made of InNP. Though the number of the well layer 12 is one in this embodiment, the number may be two or more. Though the light confinement layers 27 and 29 are made of a single kind of material, each of these layers may be made of GaNAsP with two or more sets of mole fractions.

Moreover, though the oscillation wavelength of the laser device in this embodiment is on the band of 1.3 μm, the wavelength may be on the band of 1.55 μm or on any other arbitrary band. The laser device of this embodiment is a Fabry-Perot type laser device. Alternatively, the present invention is also applicable to a distributed feedback semiconductor laser device (DFB laser device) in which a diffraction grating is formed in the vicinity of the active layer (e.g., in a region of the substrate in the vicinity of the active layer).

Embodiment 7

Figure 7A:
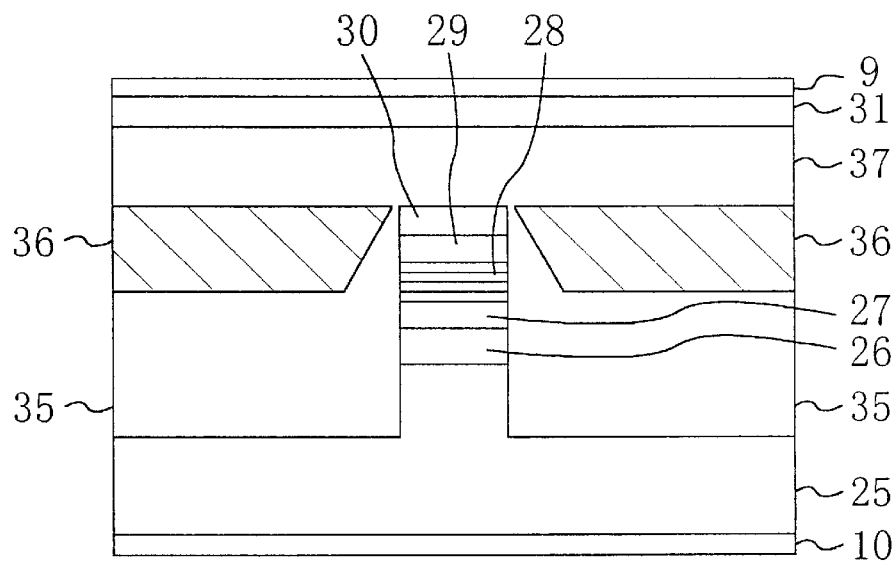
FIG. 7A is a front view illustrating a semiconductor laser device in the seventh embodiment of the present invention.

FIG. 7A is a front view of a semiconductor laser device in the seventh embodiment of the present invention. The oscillation wavelength of the semiconductor laser device is in the vicinity of 1.3 μm.

The semiconductor laser device includes an n-type GaP substrate 25 and a multi-layer structure formed on the n-type GaP substrate 25. The multi-layer structure includes: an n-type GaP cladding layer 26 having a thickness of 1.5 μm; an n-type GaNAsP light confinement layer 27; an active layer 28; a p-type GaNAsP light confinement layer 29; and a p-type GaP cladding layer 30, all of these layers being stacked in this order on the n-type GaP substrate 25. The multi-layer structure including the n-type cladding layer 26, the n-type light confinement layer 27, the active layer 28, the p-type light confinement layer 29 and the p-type cladding layer 30 is etched, thereby forming a stripe-shaped mesa extending in the laser cavity direction. A p-type GaP current blocking layer 35 and an n-type GaP current blocking layer 36 are stacked on both sides of the mesa. A p-type GaP buried layer 37 having a thickness of 2.0 µm and a p-type GaP contact layer 31 having a thickness of 1 µm are stacked over the current blocking layer 36 and the p-type cladding layer 30. Current vertically flows through this mesa. The width of the mesa is 1.5 µm. A p-side electrode 9 is in contact with the contact layer 31. An n-side electrode 10 is formed on the reverse surface of the n-type GaP substrate 25.

Figure 7B:
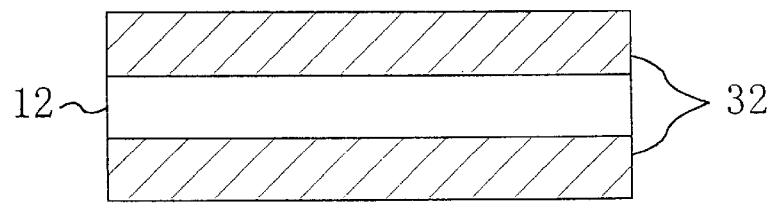
FIG. 7B is an enlarged view showing the structure of the active layer thereof.

FIG. 7B is an enlarged view of the active layer 28. The active layer 28 includes a pair of GaNAsP barrier layers 32 and an InNAsP well layer 12. The mole fractions and the thickness of the InNAsP well layer 12 are set such that the oscillation wavelength of the laser device is in the vicinity of 1.3 µm. A lattice distortion (strain) from −1.5% to +1.5% with respect to GaP is applied to the InNAsP well layer 12.

By employing such a structure, the band offset ΔEc between the GaNAsP barrier layers 32 and the InNAsP well layer 12 on the conduction band can be set at 500 meV or more, which is larger than that of a structure using a GaAs substrate. Thus, even when the temperature rises, electrons can be confined sufficiently and the resulting characteristics of the laser device are not deteriorated. Moreover, since the laser device of this embodiment has a real refractive index type waveguide structure, the laser device can be oscillated stably in a single transverse mode. In addition, since the current flows only through the active layer 28 in the mesa, current components not contributing to the laser light emission can be considerably reduced and current characteristics having a low threshold value are realized.

In this embodiment, the well layer 12 is made of InNAsP. Alternatively, the same effects can be attained if the well layer 12 is made of InNP. Though the number of the well layer 12 is one in this embodiment, the number may be two or more. Though the light confinement layers 27 and 29 are made of a single kind of material, each of these layers may be made of GaNAsP with two or more sets of mole fractions. Moreover, though the oscillation wavelength of the laser device in this embodiment is on the band of 1.3 µm, the wavelength may be on the band of 1.55 µm or on any other arbitrary band. The laser device of this embodiment is a Fabry-Perot type laser device. Alternatively, the present invention is also applicable to a distributed feedback semiconductor laser device (DFB laser device) in which a diffraction grating is formed in the vicinity of the active layer (e.g., in a region of the substrate in the vicinity of the active layer).

Embodiment 8

Figure 8A:
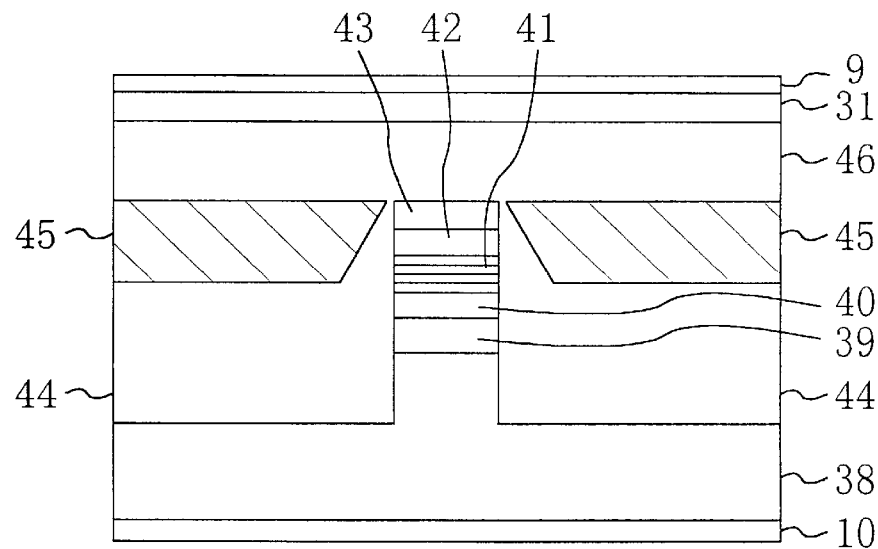
FIG. 8A is a front view illustrating a semiconductor laser device in the eighth embodiment of the present invention.

FIG. 8A is a front view of a semiconductor laser device in the eighth embodiment of the present invention. The oscillation wavelength of the semiconductor laser device is in the vicinity of 1.3 µm.

The semiconductor laser device includes an n-type Si substrate 38 and a multi-layer structure formed on the n-type Si substrate 38. The multi-layer structure includes: an n-type GaNP cladding layer 39 having a thickness of 1.5 µm; an n-type InGaNP light confinement layer 40; an active layer 41; a p-type InGaNP light confinement layer 42; and a p-type GaNP cladding layer 43, all of these layers being stacked in this order on the n-type Si substrate 38. The multi-layer structure including the n-type cladding layer 39, the n-type light confinement layer 40, the active layer 41, the p-type light confinement layer 42 and the p-type cladding layer 43 is etched, thereby forming a stripe-shaped mesa extending in the laser cavity direction. A p-type GaNP current blocking layer 44 and an n-type GaNP current blocking layer 45 are stacked on both sides of the mesa. A p-type GaNP buried layer 46 having a thickness of 2.0 µm and a p-type GaP contact layer 31 having a thickness of 0.3 µm are stacked over the current blocking layer 45 and the p-type cladding layer 43. Current vertically flows through this mesa. The width of the mesa is 1.5 µm. A p-side electrode 9 is in contact with the contact layer 31. An n-side electrode 10 is formed on the reverse surface of the n-type Si substrate 38.

Figure 8B:
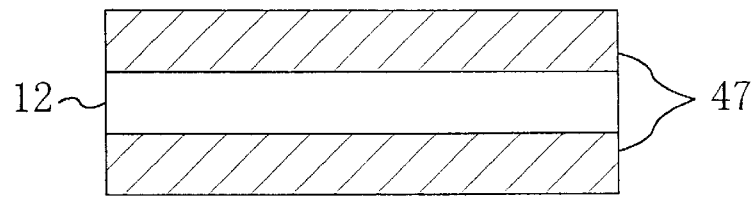
FIG. 8B is an enlarged view showing the structure of the active layer thereof.

FIG. 8B is an enlarged view of the active layer 41. The active layer 41 includes a pair of InGaNP barrier layers 47 and an InNAsP well layer 12. The mole fractions and the thickness of the InNAsP well layer 12 are set such that the oscillation wavelength of the laser device is in the vicinity of 1.3 µm. A lattice distortion (strain) from −1.5% to +1.5% with respect to Si is applied to the InNAsP well layer 12.

By employing such a structure, the band offset ΔEc between the InGaNP barrier layers 47 and the InNAsP well layer 12 on the conduction band can be set at 500 meV or more, which is larger than that of a structure using a GaAs substrate. Thus, even when the temperature rises, electrons can be confined sufficiently and the resulting characteristics of the laser device are not deteriorated. Moreover, since the laser device of this embodiment has a real refractive index type waveguide structure, the laser device can be oscillated stably in a single transverse mode. In addition, since the current flows only through the active layer 41 in the mesa, current components not contributing to the laser oscillation can be considerably reduced and current characteristics having a low threshold value are realized. Furthermore, since the substrate is made of silicon, the costs required for the substrate can be significantly reduced as compared with a case of using a substrate made of a compound semiconductor. Also, it is easy to integrate the semiconductor laser device with other electronic devices.

In this embodiment, the well layer 12 is made of InNAsP. Alternatively, the same effects can be attained if the well layer 12 is made of InNP. Though the number of the well layer 12 is one in this embodiment, the number may be two or more. Though the light confinement layers 40 and 42 are made of a single kind of material, each of these layers may be made of InGaNP with two or more sets of mole fractions. Moreover, though the oscillation wavelength of the laser device in this embodiment is on the band of 1.3 µm, the wavelength may be on the band of 1.55 µm or on any other arbitrary band. The laser device of this embodiment is a Fabry-Perot type laser device. Alternatively, the present invention is also applicable to a distributed feedback semiconductor laser device (DFB laser device) in which a diffraction grating is formed in the vicinity of the active layer (e.g., in a region of the substrate in the vicinity of the active layer).

Embodiment 9

Figure 12A:
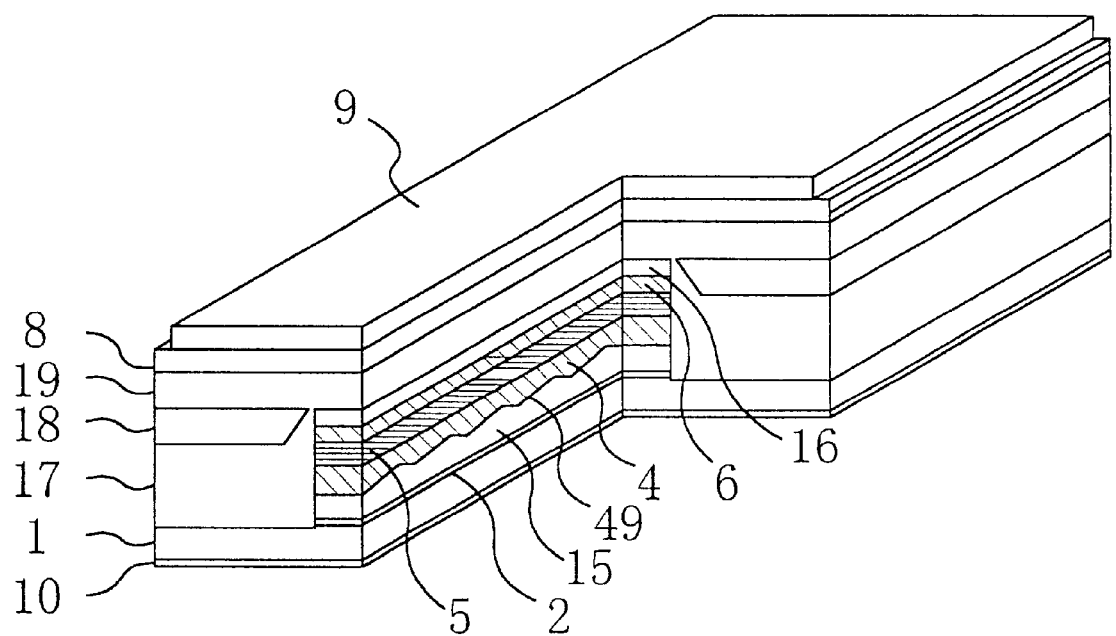
FIG. 12A is a partially sectional perspective view illustrating a semiconductor laser device (distributed feedback semiconductor laser device) in the ninth embodiment of the present invention.

FIG. 12A is a partially sectional perspective view of a semiconductor laser device in the ninth embodiment of the present invention. The semiconductor laser device of this embodiment is a distributed feedback semiconductor laser device (DFB laser device). The oscillation wavelength of the semiconductor laser device is in the vicinity of 1.3 µm.

The semiconductor laser device includes an n-type GaAs substrate 1 and a multi-layer structure formed on the n-type GaAs substrate 1. The multi-layer structure includes: an n-type GaAs buffer layer 2 having a thickness of 1 µm; an n-type $In_{0.5}Ga_{0.5}P$ cladding layer 15 having a thickness of 1.5 µm; an n-type GaAs light confinement layer 4 having a thickness of 100 nm; an active layer 5; a p-type GaAs light confinement layer 6 having a thickness of 100 nm; and a p-type $In_{0.5}Ga_{0.5}P$ cladding layer 16 having a thickness of 0.2 µm, all of these layers being stacked in this order on the n-type GaAs substrate 1. The multi-layer structure including the n-type $In_{0.5}Ga_{0.5}P$ cladding layer 15, the n-type GaAs light confinement layer 4, the active layer 5, the p-type GaAs light confinement layer 6 and the p-type $In_{0.5}Ga_{0.5}P$ cladding layer 16 layer 6 and the p-type $In_{0.5}Ga_{0.5}P$ cladding layer 16 forms a stripe-shaped mesa extending in the laser cavity direction. A p-type $In_{0.5}Ga_{0.5}P$ current blocking layer 17 and an n-type $In_{0.5}Ga_{0.5}P$ current blocking layer 18 are stacked on both sides of the mesa. A p-type $In_{0.5}Ga_{0.5}P$ buried layer 19 having a thickness of 2.0 μm and a p-type GaAs contact layer 8 having a thickness of 1 μm are stacked over the current blocking layer 18 and the p-type cladding layer 16. Current vertically flows through this mesa. The width of the mesa is 1.5 μm. A p-side electrode 9 is in contact with the contact layer 8. An n-side electrode 10 is formed on the reverse surface of the n-type GaAs substrate 1.

In this embodiment, after the n-type $In_{0.5}Ga_{0.5}P$ cladding layer 15 has been deposited and before the n-type GaAs light confinement layer 4 is deposited, a diffraction grating 49 is formed through etching. The diffraction grating 49 functions in such a manner as to stably oscillate the laser device in a single longitudinal mode.

Figure 12B:
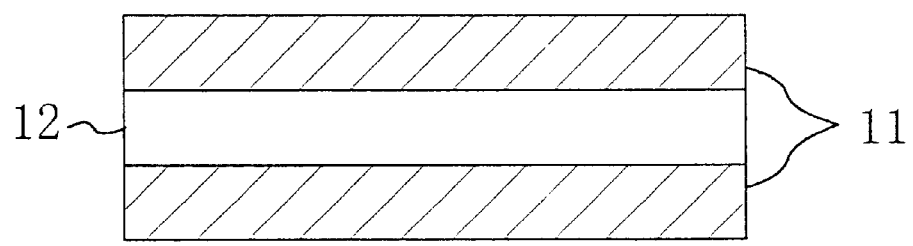
FIG. 12B is an enlarged view showing the structure of the active layer thereof.

FIG. 12B is an enlarged view of the active layer 5. The active layer 5 has a structure in which a pair of GaAs barrier layers 11 sandwich an InNAsP well layer 12 therebetween. The mole fractions and the thickness of the InNAsP well layer 12 are set such that the oscillation wavelength of the laser device is in the vicinity of 1.3 μm. A lattice distortion (strain) from −1.5% to +1.5% with respect to GaAs is applied to the InNAsP well layer 12.

By employing such a structure, the band offset ΔEc between the GaAs barrier layers 11 and the InNAsP well layer 12 on the conduction band can be set at 200 meV or more and the band offset ΔEv therebetween on the valence band can be set at 100 meV or less. Thus, even when the temperature rises, electrons can be confined sufficiently and the resulting characteristics of the laser device are not deteriorated.

In this embodiment, the well layer 12 is made of InNAsP. Alternatively, the same effects can be attained if the well layer 12 is made of InNP. Though the number of the well layer 12 in the active layer 5 is one in this embodiment, the number may be two or more.

In this embodiment, the barrier layers 11 and the light confinement layers 4 and 6 are made of GaAs. Alternatively, InGaAsP may be used instead. Though the light confinement layers 4 and 6 are made of a single kind of material, each of these layers may be made of InGaAsP with two or more sets of mole fractions. The cladding layers 15 and 16 are made of AlGaAs. Alternatively, InGaAsP that is lattice-matched with GaAs and has large band gap energy may be used instead.

Moreover, though the oscillation wavelength of the laser device in this embodiment is on the band of 1.3 μm, the wavelength may be on the band of 1.55 μm or on any other arbitrary band.

Embodiment 10

Figure 13:
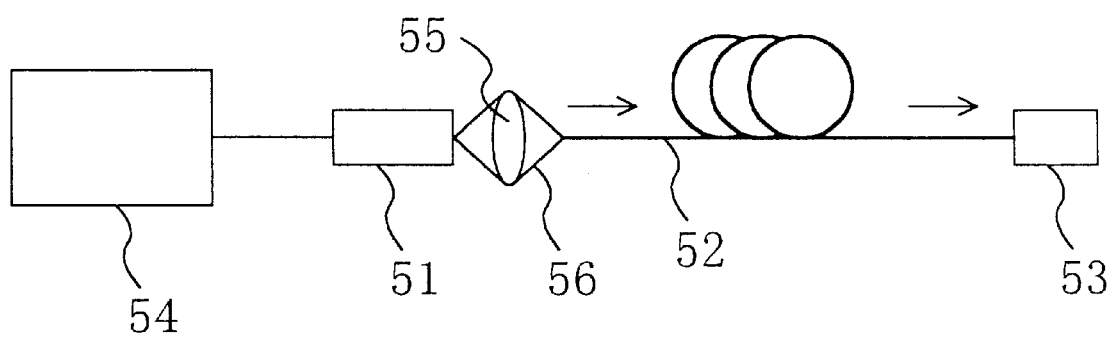
FIG. 13 is a diagram showing an arrangement for the optical communication system of the present invention.

FIG. 13 illustrates an exemplary arrangement of an optical communication system using, as a light source, the semiconductor laser device in one of the foregoing first to ninth embodiments.

This system includes: a semiconductor laser device 51 of the present invention; an electric signal generator 54 for providing an electric signal to the semiconductor laser device 51 and modulating the intensity thereof; an optical fiber 52 for propagating the laser light (optical signals) 56 emitted from the semiconductor laser device 51; a lens 55 for condensing the laser light 56 emitted from the semiconductor laser device 51 onto the optical fiber 52; and a photodetector 53 for detecting the optical signals propagated through the optical fiber 52 and transducing the optical signals into electric signals. By utilizing such an arrangement, audio signals, video signals and/or data can be transmitted through the optical fiber 52.

In this embodiment, since the semiconductor laser device used as a signal light source can operate at a low threshold current value and with high-slope efficiency characteristics over a wide temperature range, signals of high fidelity can be transmitted without being affected by the temperature so much.

It is noted that the lens is not an indispensable component.

Embodiment 11

Figure 14:
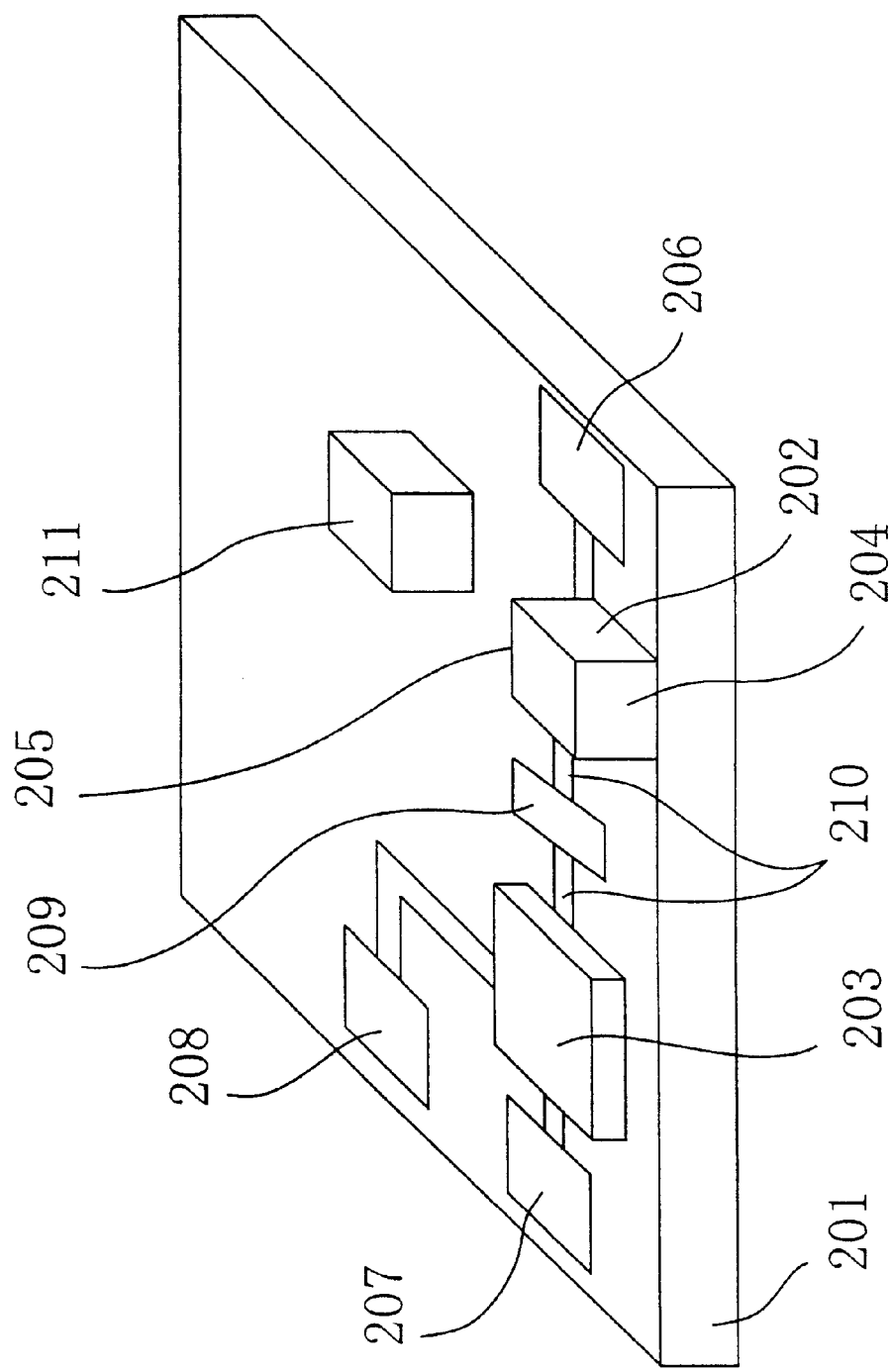
FIG. 14 is a perspective view illustrating a semiconductor laser device in the eleventh embodiment of the present invention.

FIG. 14 illustrates a semiconductor laser device in the eleventh embodiment of the present invention. The semiconductor laser device of this embodiment includes a laser section 202 and a transistor section 203 that are integrated on the same semiconductor substrate.

The laser section 202 includes a multi-layer structure formed on a semi-insulating GaAs substrate 201. The multi-layer structure includes an $InN_xAs_yP_{1-x-y}$ (where 0<x<1 and 0≦y<1) layer as an active layer. The specific structure of the laser section 202 may be that of the semiconductor laser device in any of the foregoing embodiments. The oscillation wavelength of the laser device is on the band from 1.1 to 1.6 μm.

In order to control the current to be injected into the laser section 202, the transistor section 203 is formed at a position distant from the laser section 202 on the GaAs substrate 201. Both the laser section 202 and the transistor section 203 include a semiconductor layer grown on the GaAs substrate 201 as a component. The laser section 202 and the transistor section 203 are bonded with the GaAs substrate 201 at atomic level.

Figure 17:
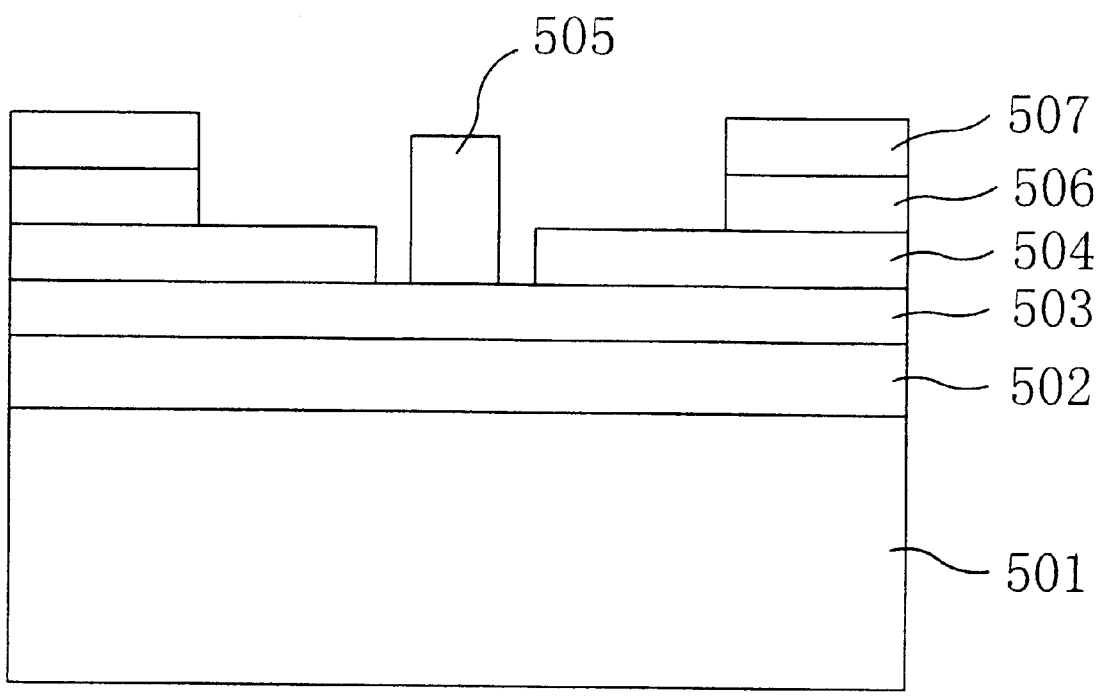
FIG. 17 is a cross-sectional view illustrating a transistor section in the semiconductor laser device of the present invention.

FIG. 17 illustrates an exemplary cross-sectional structure of the transistor section 203. As can be understood from FIG. 17, the transistor section 203 includes a plurality of semiconductor layers and electrodes that are all formed on a substrate 501 (i.e., the substrate 201 shown in FIG. 14). More specifically, an n-GaAs layer 502 and an i-GaAs layer 503 are formed in this order on the substrate 501. An Al gate electrode 505 is formed on the channel region of the i-GaAs layer 503. An Au/Ge/Ni—Au electrode 506 and an Au electrode 507 are formed over the source/drain regions of the i-GaAs layer 503 via an n⁺-GaAs layer 504.

Referring back to FIG. 14, the light emission surface 204 of the laser section 202 is coated with a low-reflection film. Another surface 205 of the laser section 202 is coated with a high-reflection film. A monitoring diode 211 for receiving monitoring light emitted from the surface 205 of the laser section 202 is disposed at a position on the GaAs substrate 201 so as to face the surface 205.

On the upper surface of the GaAs substrate 201, an electrode 206 connected to the laser section 202 and electrodes 207 and 208 connected to the transistor section 203 are provided. The laser section 202 and the transistor section 203 are connected to each other by the electrode 210 and via a capacitor 209.

In operation, direct current is supplied to the electrode 206. The current supplied from the electrode 207 to the transistor section 203 is modulated by the transistor section 203. The modulated current is supplied to the laser section 202 via the capacitor 209. The modulation by the transistor section 203 is performed by the alternating current supplied to the electrode 208 connected to the gate electrode (i.e., the Al electrode 505 shown in FIG. 17) of the transistor section 203.

Conventionally, a separately formed laser section has been mounted, with solder or the like, on a GaAs substrate including transistors thereon. Thus, in a conventional device, it has been necessary to connect the transistor section to the laser section with lead wires such as Au wires. However, the lengths of lead wires are very likely to vary. Accordingly, the little variation in lengths of lead wires considerably changes the radio frequency characteristics of the laser device.

According to the present invention, it is possible to form the laser section 202 for outputting laser light having a long wavelength on the GaAs substrate 201 through crystal growth. Thus, the electrode 210 connecting the transistor section 203 and the laser section 202 to each other can be formed through a thin film patterning process. Consequently, the variation in lengths and widths of the electrodes can be minimized, thereby solving the above-described problems.

In this embodiment, the substrate is made of GaAs. Alternatively, the substrate may be made of Si. The monitoring diode 211 may also be formed on the substrate 201 through crystal growth. It is noted that it is not always necessary to coat the laser section 202 with the low-reflection film or the high-reflection film.

Embodiment 12

Figure 15:
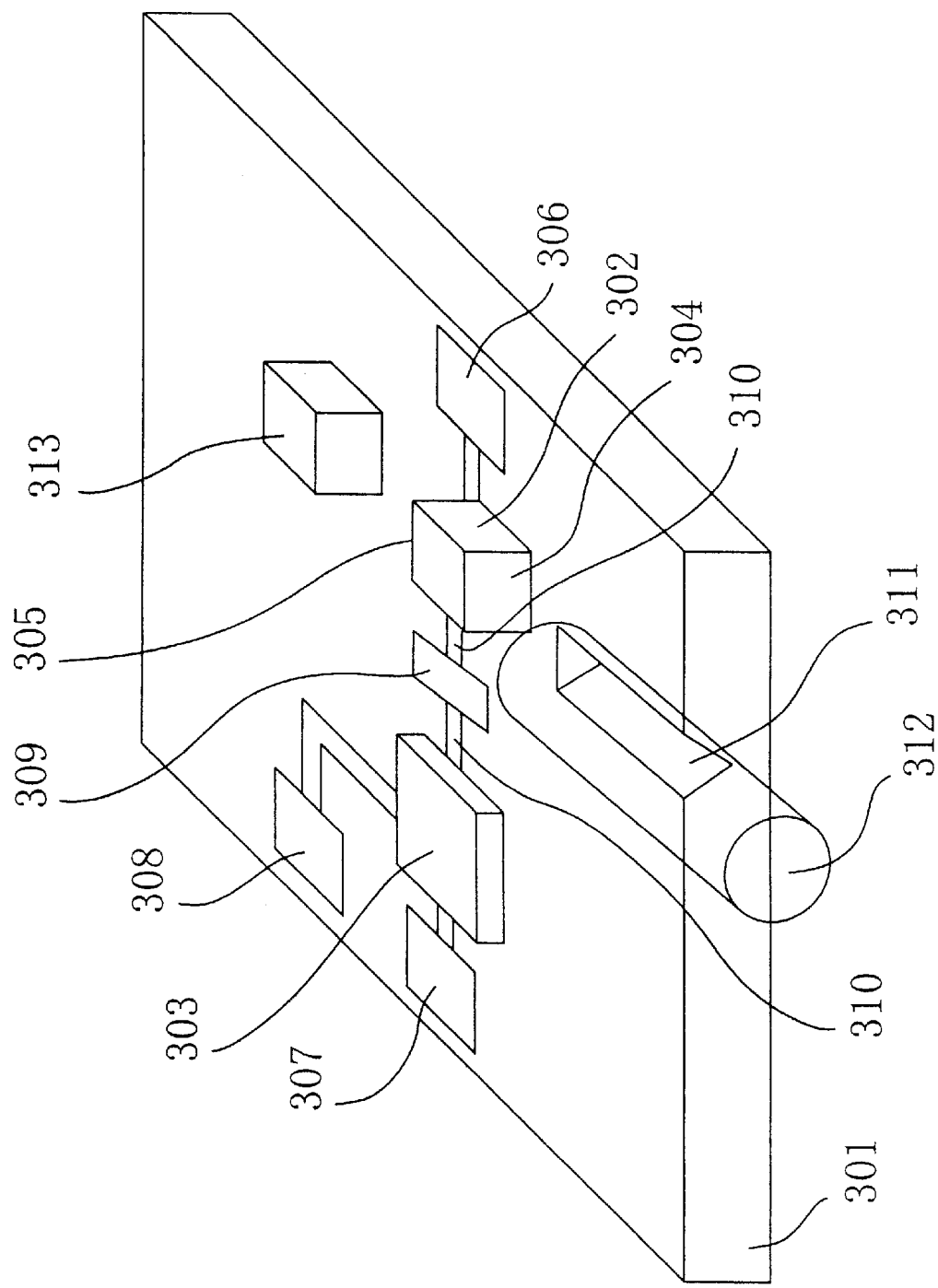
FIG. 15 is a perspective view illustrating a semiconductor laser device in the twelfth embodiment of the present invention.

FIG. 15 illustrates a semiconductor laser device in the twelfth embodiment of the present invention. The semiconductor laser device of this embodiment includes a laser section 302 and a transistor section 303 that are integrated on the same semiconductor substrate.

The laser section 302 includes a multi-layer structure formed on a semi-insulating Si substrate 301. The multi-layer structure includes an $InN_xAs_yP_{1-x-y}$ (where 0<x<1 and 0≦y<1) layer as an active layer. The specific structure of the laser section 302 may be that of the semiconductor laser device in any of the foregoing embodiments. The oscillation wavelength of the laser device is on the band from 1.1 to 1.6 $\mu$m.

In order to control the current to be injected into the laser section 302, the transistor section 303 is formed at a position distant from the laser section 302 on the Si substrate 301. Both the laser section 302 and the transistor section 303 include a semiconductor layer grown on the Si substrate 301 as a component. The laser section 302 and the transistor section 303 are bonded with the Si substrate 301 at atomic level.

The light emission surface 304 of the laser section 302 is coated with a low-reflection film. Another surface 305 of the laser section 302 is coated with a high-reflection film. A monitoring diode 313 for receiving monitoring light emitted from the surface 305 of the laser section 302 is disposed at a position on the Si substrate 301 so as to face the surface 305.

On the upper surface of the Si substrate 301, an electrode 306 connected to the laser section 302 and electrodes 307 and 308 connected to the transistor section 303 are provided. The laser section 302 and the transistor section 303 are connected to each other by an electrode 310 and via a capacitor 309.

In operation, direct current is supplied to the electrode 306. The current supplied from the electrode 307 to the transistor section 303 is modulated by the transistor section 303. The modulated current is supplied to the laser section 302 via the capacitor 309. The modulation by the transistor section 303 is performed by the alternating current supplied to the electrode 308 connected to the gate electrode (i.e., the Al electrode 505 shown in FIG. 17) of the transistor section 303.

A V-shaped groove 311 is formed in surface of the Si substrate 301 in the vicinity of the light emission surface 304 of the laser section 302, and supports and fixes an optical fiber 312. The laser light emitted from the laser section 302 is directly coupled to the optical fiber 312.

In a conventional structure, a laser section for outputting laser light on a long wavelength band cannot be formed on a GaAs substrate through crystal growth. Also, in a conventional structure, it is impossible to set the positional alignment accuracy between the groove and the laser section at 1 $\mu$m or less, and the efficiency with which the laser light is coupled to the optical fiber disposed on the V-shaped groove is low.

According to the present invention, it is possible to form the laser section 302 on the Si substrate 301 through crystal growth. Thus, after the laser section 302 has been formed, the V-shaped groove 311 can be formed by performing a process using a mask pattern. As a result, it is possible to set the positional alignment accuracy between the V-shaped groove 311 and the laser section 302 at 1 $\mu$m or less, and the coupling efficiency between the laser light and the optical fiber 312 disposed on the V-shaped groove 311 can be considerably improved.

In this embodiment, the substrate is made of Si. Alternatively, the substrate may be made of GaAs. In addition, the monitoring diode 313 may also be formed on the substrate 301 through crystal growth.

Embodiment 13

Hereinafter, a method for fabricating a semiconductor laser device will be described with reference to FIGS. 16A through 16D.

Figure 16A:
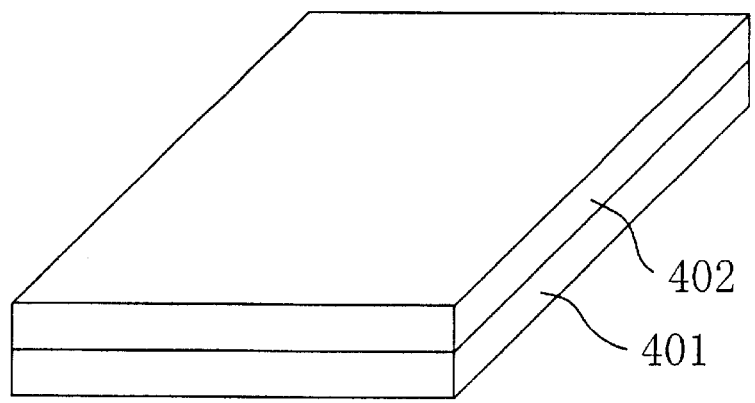
FIGS. 16A through 16D are perspective views illustrating a method for fabricating a semiconductor laser device in the thirteenth embodiment of the present invention.

First, as shown in FIG. 16A, a multi-layer film 402 including an $InN_xAs_yP_{1-x-y}$ (where 0<x<1 and 0≦y<1) layer as an active layer is epitaxially grown on a semi-insulating GaAs substrate 401 by an MOVPE method. The oscillation wavelength is adjusted to be on the band from 1.1 to 1.6 $\mu$m.

Figure 16B:
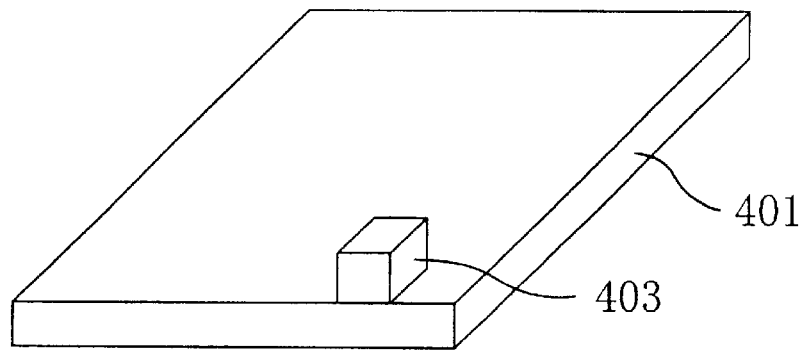

Next, as shown in FIG. 16B, the multi-layer film 402 is patterned by utilizing known lithography and etching techniques, thereby forming a laser section 403 having a laser cavity structure.

Figure 16C:
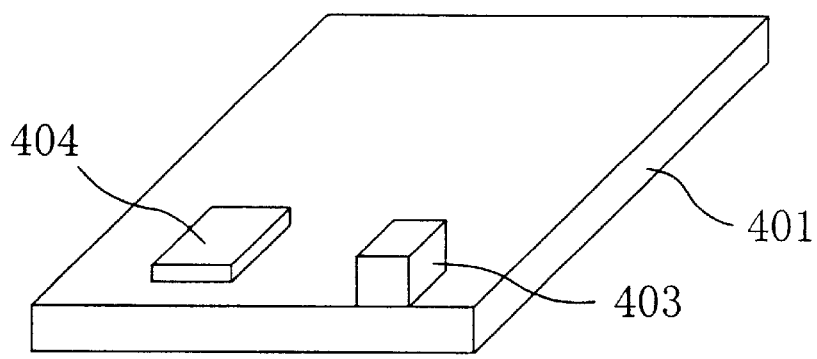

Then, as shown in FIG. 16C, a transistor section 404 is formed. An exemplary cross section of the transistor section 404 is illustrated in FIG. 17. The n-GaAs layer 502, the i-GaAs layer 503 and the n$^+$-GaAs layer 504 are formed by commonly used MOVPE or MBE method. These GaAs layers may be deposited over the entire surface of the substrate 401 and then patterned. Alternatively, these layers may be selectively grown over a particular region of the substrate 401.

Figure 16D:
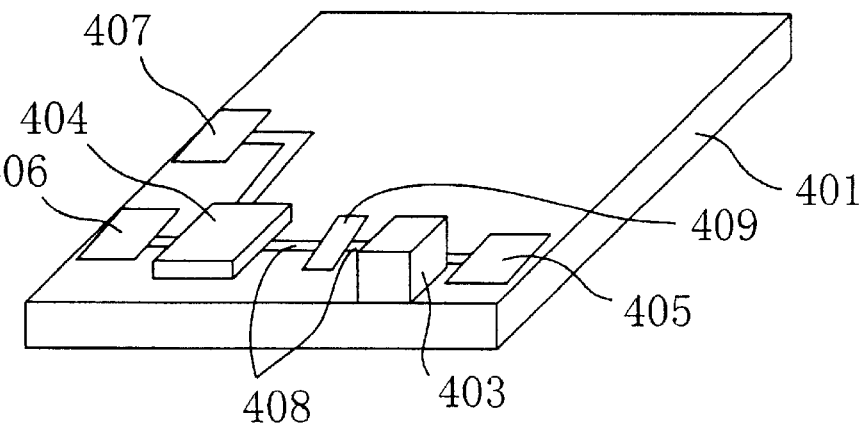

Subsequently, as shown in FIG. 16D, a thin film having electrical conductivity is deposited and electrodes 405, 406, 407, 408 and a capacitor 409 are formed by lithography and etching techniques. The electrode 406 supplies direct current to the transistor section 404. The electrode 407 supplies alternating current to the transistor section 404. The electrode 408 transfers current from the transistor section 404 to the laser section 403.

In accordance with this fabrication method, after the laser section 403 has been formed through a process step performed at a relatively high temperature, the transistor section 404 is formed through a process step, such as ion implantation, performed at a relatively low temperature. Thus, the thermal diffusion of the implanted ions can be suppressed, whereby it is possible to prevent the performance of the transistor section 404 from being deteriorated.

It is noted that when the $InN_xAs_yP_{1-x-y}$ (where 0<x<1 and 0≦y<1) layer is formed by an MOVPE method, source gases for In, N, As and P, as well as hydrogen or nitrogen functioning as a carrier gas, are supplied into a reactor tube. As the source gases for In, N, As and P, trimethylindium, dimethylhydrazine, tertiarybutylarsine and tertiarybutylphosphine may be used. The $InN_xAs_yP_{1-x-y}$ crystal layer may be grown on a substrate by setting the temperature of the substrate at 600° C., for example. It is also noted that arsine may be used as a source material for As and phosphine may be used as a source material for P. Monomethylhydrazine or tertiarybutylhydrazine may also be used as a source material for N.

According to the present invention, an organometallic gas having a lower decomposition point than that of ammonium is used as a source gas for supplying nitrogen, thereby growing $InN_xAs_yP_{1-x-y}$ (where 0<x<1 and 0≦y<1) mixed crystals on a semiconductor substrate. More specifically, by thermally decomposing a mixture of a gas containing As, a gas containing P, an organometallic gas containing In and an organometallic gas containing N, the InNAsP mixed crystals are grown on a substrate made of InP, GaAs, GaP or Si. As the organometallic gas containing N, $CH_3N_2H_3$ (monomethylhydrazine), $(CH_3)_2N_2H_2$ (dimethylhydrazine) or $t-C_4H_9N_2H_3$ (tertiarybutylhydrazine) may be used.

In the conventional MOVPE method, ammonium has been widely used as a source gas for supplying nitrogen. However, the present inventors did not find it appropriate to use ammonium for growing the InNAsP mixed crystals. The reason is as follows. Since ammonium does not decompose in the temperature range (from about 500 to about 600° C.) preferably set when the InAsP mixed crystals including In having a high vapor pressure are grown by the MOVPE method, a sufficient amount of nitrogen cannot be introduced into the InAsP mixed crystals by using ammonium as a source gas.

Thus, the present inventors use an organometallic gas having a lower decomposition point than that of ammonium, such as monomethylhydrazine, dimethylhydrazine or tertiarybutylhydrazine, instead of ammonium. The 50% decomposition point of ammonium is as high as about 1000° C. By contrast, the 50% decomposition points of monomethylhydrazine and dimethylhydrazine are about 300° C., and the 50% decomposition point of tertiarybutylhydrazine is about 500° C. Since these organometallic gases containing N are decomposed at much lower temperatures than that of ammonium, the InNAsP mixed crystals containing In having a high vapor pressure can be grown at low temperatures.

$As(C_4H_9)H_2$ (tertiarybutylarsine) may be used as a source for As, and $P(C_4H_9)H_2$ (tertiarybutylphosphine) may be used as a source for P. The decomposition point of tertiarybutylarsine is lower than that of arsine. Also, the decomposition point of tertiarybutylphosphine is lower than that of phosphine. Thus, if these organometallic gases are used, InNAsP mixed crystals having excellent crystallinity can be grown at a low temperature.

By using, as a carrier gas, an inert gas having a larger molecular weight than that of hydrogen, it is possible to prevent N from being dissociated from the surface of a growing InNAsP film. As a result, InNAsP mixed crystals having a large mole fraction of N can be obtained.

Embodiment 14

Hereinafter, a method for growing $InN_xAs_yP_{1-x-y}$ (where 0<x<1 and 0≦y<1) mixed crystals in the fourteenth embodiment of the present invention will be described with reference to FIG. 18.

Figure 18:
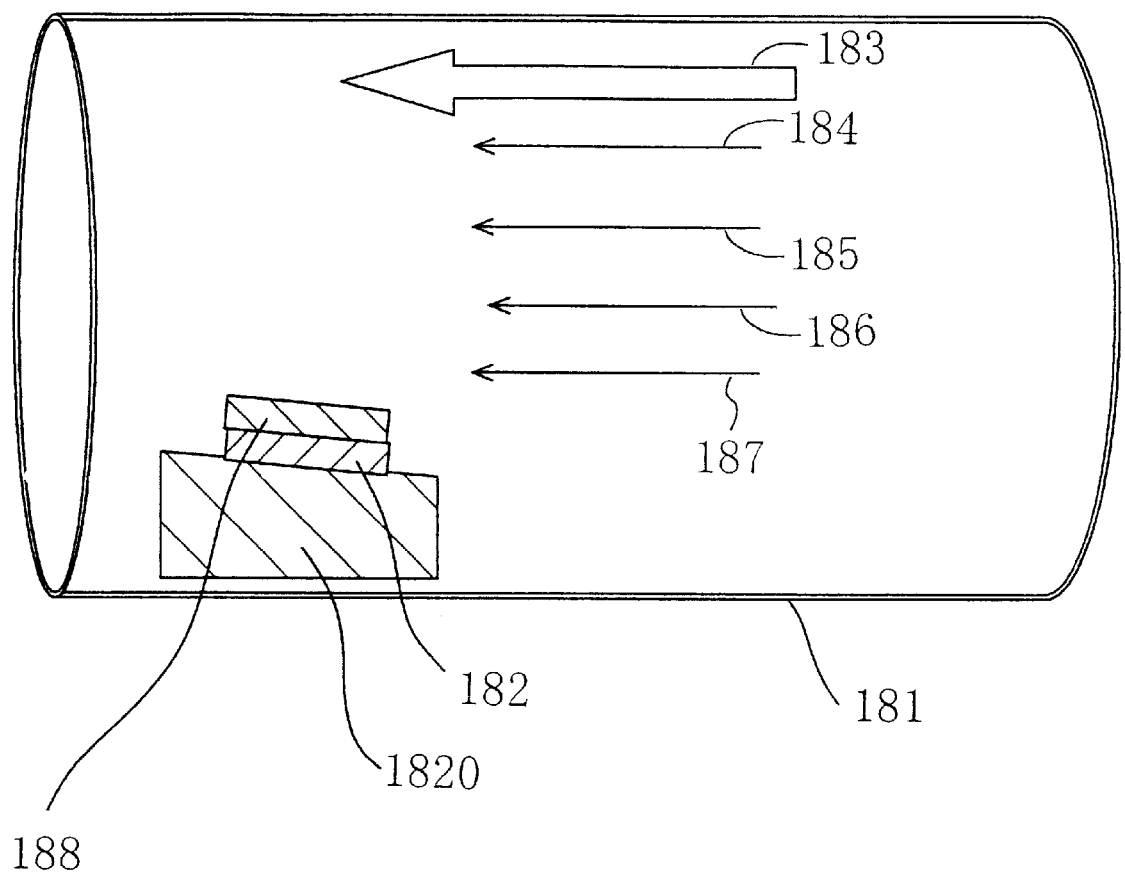
FIG. 18 is a diagram illustrating a method for growing InNAsP mixed crystals in the fourteenth embodiment of the present invention.

As shown in FIG. 18, a GaAs substrate 182 is disposed on a susceptor 1820 placed in a reactor tube 181. Source gases for In, N, As and P are supplied into the reactor tube 181 together with hydrogen 183 functioning as a carrier gas. In this embodiment, trimethylindium 184, dimethylhydrazine 185, tertiarybutylarsine 186 and tertiarybutylphosphine 187 are used as the source gases for In, N, As and P, respectively. The temperature of the substrate 182 is preferably in the range from about 500 to about 700° C., e.g., 600° C. in this embodiment, thereby growing the $InN_xAs_yP_{1-x-y}$ crystal layer 188 on the GaAs substrate 182. During this crystal growth, the temperature at the bubbler of trimethylindium 184 is set at 25° C. and the flow rate thereof is set at 200 sccm. The flow rates of dimethylhydrazine 185, tertiarybutylarsine 186 and tertiarybutylphosphine 187 are set at 500 sccm, 5 sccm and 5 sccm, respectively. Dimethylhydrazine 185, tertiarybutylarsine 186 and tertiarybutylphosphine 187 are all supplied from the respective bubblers thereof into the reactor tube 181 directly.

In accordance with the method of this embodiment, an $InN_{0.3}As_{0.2}P_{0.5}$ mixed crystal layer 188 can be grown on the GaAs substrate 181 in this way. The mole fractions x and y of the $InN_xAs_yP_{1-x-y}$ (where 0<x<1 and 0≦y<1) mixed crystal layer 188 may be controlled by adjusting the flow rate ratio of dimethylhydrazine 185, tertiarybutylarsine 186 and tertiarybutylphosphine 187.

The substrate 182 may be made of InP, GaP or Si, instead of GaAs. Arsine may also be used as a source material for As and phosphine may also be used as a source material for P. Monomethylhydrazine or tertiarybutylhydrazine may also be used as a source material for N.

Embodiment 15

Hereinafter, a method for growing InNAsP mixed crystals in the fifteenth embodiment of the present invention will be described with reference to FIG. 19.

Figure 19:
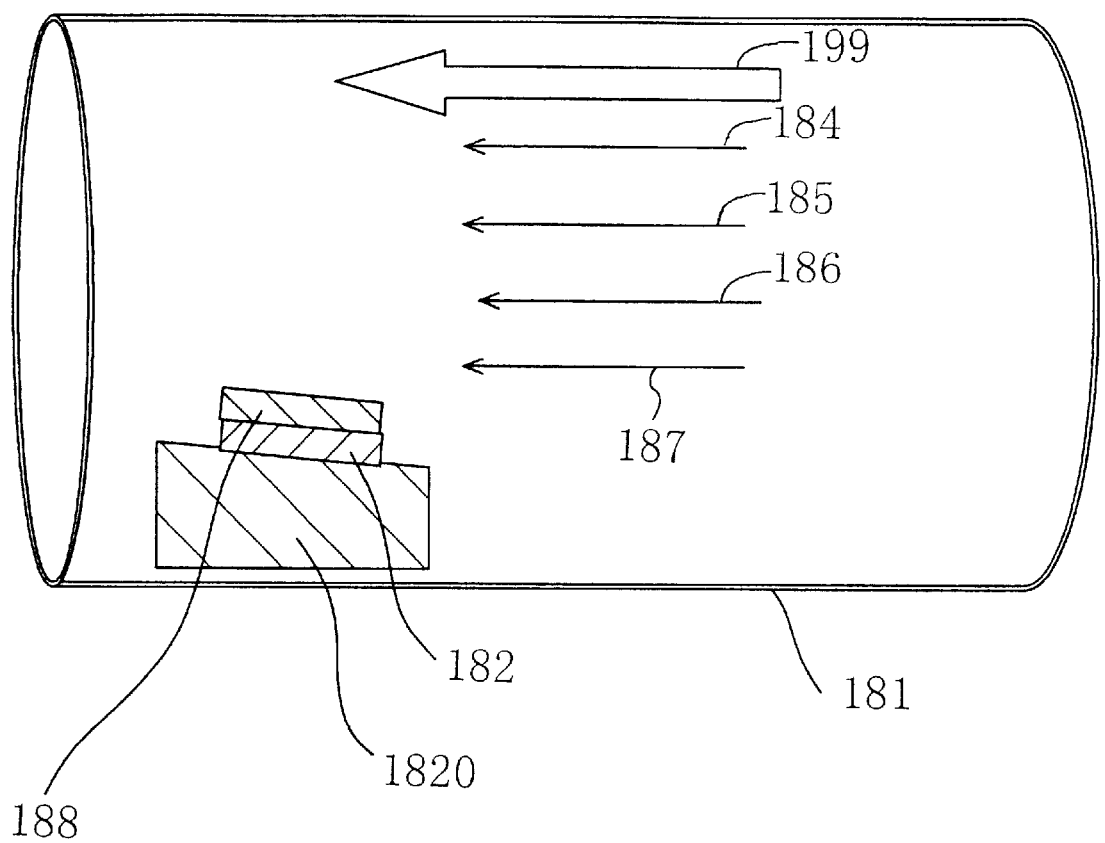
FIG. 19 is a diagram illustrating a method for growing InNAsP mixed crystals in the fifteenth embodiment of the present invention.

As shown in FIG. 19, a GaAs substrate 182 is disposed on a susceptor 1820 placed in a reactor tube 181. Source gases for In, N, As and P are supplied into the reactor tube 181 together with nitrogen 199 functioning as a carrier gas. In this embodiment, trimethylindium 184, dimethylhydrazine 185, tertiarybutylarsine 186 and tertiarybutylphosphine 187 are used as the source gases for In, N, As and P, respectively. The temperature of the substrate 182 is set at 600° C., thereby growing an $InN_xAs_yP_{1-x-y}$ crystal layer 188 on the GaAs substrate 182.

During this crystal growth, the temperature at the bubbler of trimethylindium 184 is set at 25° C. and the flow rate thereof is set at 200 sccm. The flow rates of dimethylhydrazine 185, tertiarybutylarsine 186 and tertiarybutylphosphine 187 are set at 500 sccm, 5 sccm and 5 sccm, respectively. Dimethylhydrazine 185, tertiarybutylarsine 186 and tertiarybutylphosphine 187 are all supplied from the respective bubblers thereof into the reactor tube 181 directly.

In accordance with the method of this embodiment, an $InN_{0.3}As_{0.2}P_{0.5}$ mixed crystal layer 188 can be grown on the GaAs substrate 181 in this way. The mole fractions x and y of the $InN_xAs_yP_{1-x-y}$ (where 0<x<1 and 0≦y<1) mixed crystal layer 188 may be controlled by adjusting the flow rate ratio of dimethylhydrazine 185, tertiarybutylarsine 186 and tertiarybutylphosphine 187.

The substrate 182 may be made of InP, GaP or Si, instead of GaAs. Arsine may also be used as a source material for As and phosphine may also be used as a source material for P. Monomethylhydrazine or tertiarybutylhydrazine may also be used as a source material for N.

Figure 20A:
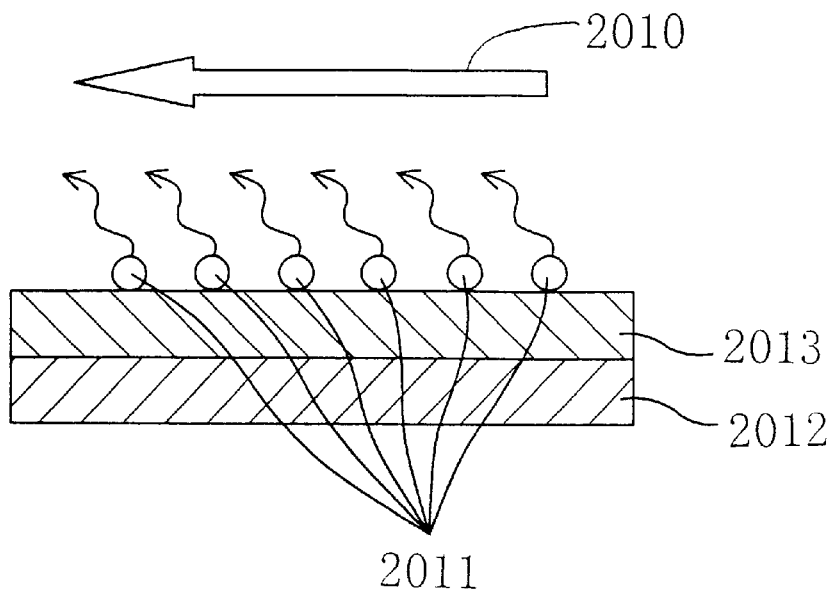
FIG. 20A is a diagram showing a crystal growth process where hydrogen is used as a carrier gas.

As schematically shown in FIG. 20A, if hydrogen 2010 is used as a carrier gas, nitrogen atoms 2011 having a high vapor pressure are more likely to be dissociated from a growing film 2013 on a substrate 2012. Thus, even when the flow rate of dimethylhydrazine is increased, the N mole fraction of the growing film 2013 does not increase so much.

Figure 20B:
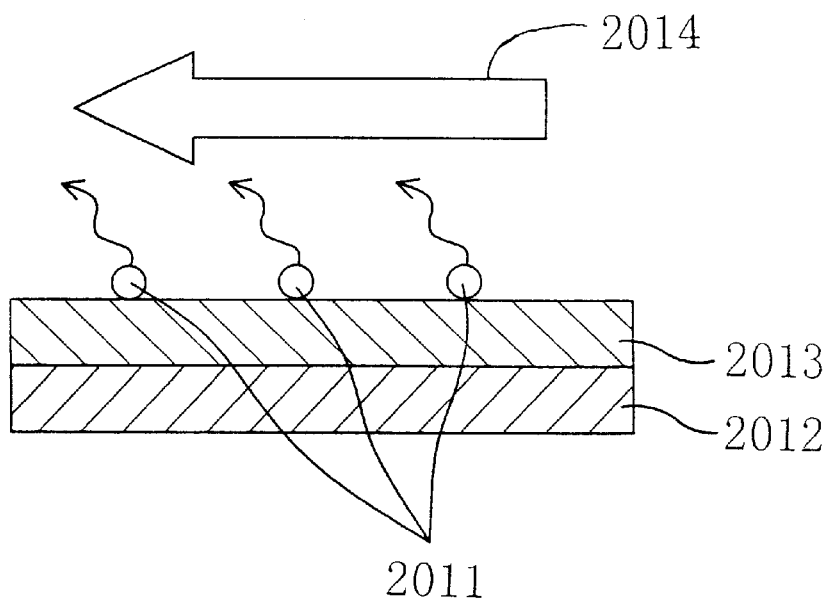
FIG. 20B is a diagram showing a crystal growth process where nitrogen is used as a carrier gas.

On the other hand, if nitrogen 2014 is used as a carrier gas, the dissociation of nitrogen atoms 2011 from the growing film 2013 is suppressed as schematically shown in FIG. 20B. This is because the molecular weight of nitrogen is larger than that of hydrogen.

Figure 21:
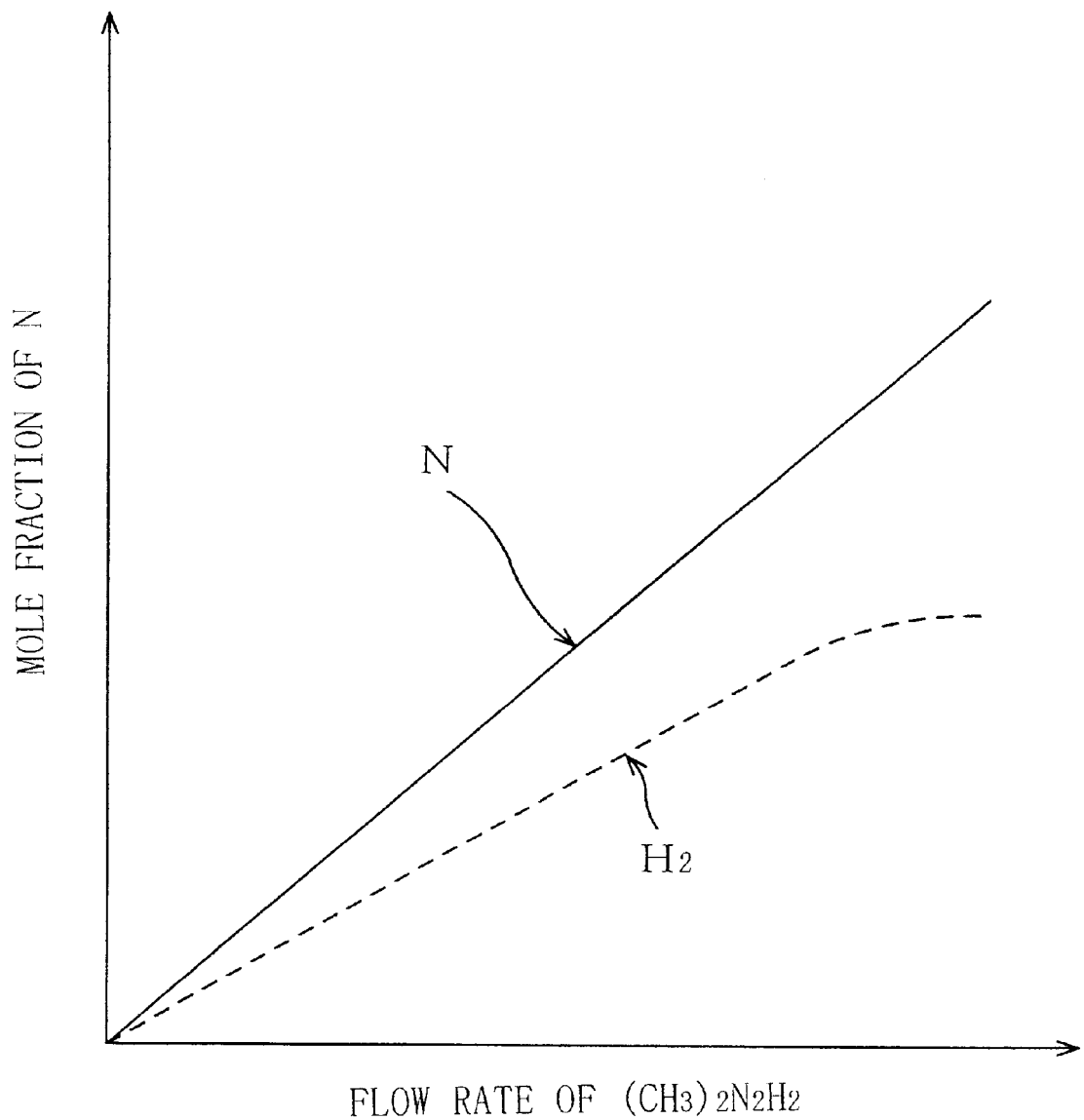
FIG. 21 is a graph showing the relationships between the flow rate of dimethylhydrazine and the mole fraction of N where hydrogen and nitrogen are used as respective carrier gases.

FIG. 21 illustrates the relationship between the flow rate of dimethylhydrazine on the axis of abscissas and the N mole fraction on the axis of ordinates. In the case of using hydrogen as a carrier gas, as the flow rate of dimethylhydrazine increases, the N mole fraction also increases correspondingly until a certain point, but the increase tends to be saturated thereafter, as indicated by the broken line. On the other hand, in the case of using nitrogen as a carrier gas, the resulting N mole fraction with respect to the same flow rate of dimethylhydrazine is larger than that of the hydrogen carrier gas, and no saturation is observed, as indicated by the solid line.

In this way, $InN_{0.3}As_{0.2}P_{0.5}$ mixed crystals having a larger N mole fraction as compared with the case of using the method of the fourteenth embodiment can be grown in this embodiment on the GaAs substrate.

As described above, according to the present invention, $InN_xAs_yP_{1-x-y}$ (where $0<x<1$ and $0\leq y<1$) mixed crystals having excellent crystallinity can be grown on a substrate made of InP, GaAs, GaP or Si by the MOVPE method.

Thus, various types of compound semiconductor devices, such as a semiconductor laser device, can be mass-produced by using the $InN_xAs_yP_{1-x-y}$ (where $0<x<1$ and $0\leq y<1$) mixed crystals produced in this manner.

What is claimed is:

1. A semiconductor laser device comprising a GaAs substrate and a multi-layer structure formed on the GaAs substrate, wherein the multi-layer structure includes an active layer for emitting light, and wherein the active layer includes an $InN_xAs_yP_{1-x-y}$ (where $0<x<1$ and $0\leq y<1$) layer that is lattice-matched with the GaAs substrate.

2. The semiconductor laser device of claim 1, wherein the active layer has a quantum well structure including at least one well layer and at least two barrier layers, wherein the well layer is an $InN_xAs_yP_{1-x-y}$ (where $0<x<1$ and $0\leq y<1$) layer.

3. The semiconductor laser device of claim 2, wherein the barrier layers are made of a material selected from the group consisting of AlGaInP, AlGaAs, GaAs, InGaAsP and InGaP.

4. The semiconductor laser device of claim 1, wherein the multi-layer structure further comprises:

a first cladding layer, which has the same conductivity type as that of the substrate and is located below the active layer; and a second cladding layer and a contact layer, which have a different conductivity type from that of the substrate and are located above the active layer, and wherein an electrode is disposed on the contact layer to be in contact with each other in a stripe region.

5. The semiconductor laser device of claim 4, wherein a portion of the multi-layer structure, including the second cladding layer and the contact layer that have the different conductivity type from that of the substrate, is formed in a ridge shape.

6. The semiconductor laser device of claim 1, wherein the multi-layer structure further comprises:

a first cladding layer, which has the same conductivity type as that of the substrate and is located below the active layer; and a second cladding layer, which has a different conductivity type from that of the substrate and is located above the active layer, and wherein the second cladding layer having the different conductivity type from that of the substrate has a ridge-shaped portion, and wherein a current blocking layer having the same conductivity type as that of the substrate is disposed to sandwich the ridge-shaped portion therebetween, and wherein a buried layer having the different conductivity type from that of the substrate is disposed on the current blocking layer.

7. The semiconductor laser device of one of claims 4 to 6, wherein the cladding layers are made of a material selected from the group consisting of GaAs, AlGaAs, InGaP and InGaAsP.

8. The semiconductor laser device of claim 6, wherein the cladding layers, the current blocking layer and the buried layer are made of a material selected from the group consisting of GaAs, AlGaAs, InGaP and InGaAsP.

9. The semiconductor laser device of claim 1, wherein the multi-layer structure further comprises:

a first cladding layer, which has the same conductivity type as that of the substrate and is located below the active layer;

a second cladding layer, which has a different conductivity type from that of the substrate and is located above the active layer;

a current blocking layer, which has the same conductivity type as that of the substrate and is disposed above the second cladding layer having the different conductivity type from that of the substrate; and a buried layer, which has the different conductivity type from that of the substrate and is disposed over the current blocking layer, wherein a part of the buried layer is in contact with the second cladding layer having the different conductivity type from that of the substrate in a stripe region.

10. The semiconductor laser device of claim 9, wherein the cladding layers, the current blocking layer and the buried layer are made of a material selected from the group consisting of GaAs, AlGaAs, InGaP and InGaAsP.

11. The semiconductor laser device of claim 1, wherein the multi-layer structure further comprises:

a first cladding layer, which has the same conductivity type as that of the substrate and is located below the active layer; and a second cladding layer and a contact layer, which have a different conductivity type from that of the substrate and are located above the active layer, and wherein a part of the GaAs substrate and a portion including the cladding layers and the active layer are formed to have a mesa shape, and wherein both side regions of the mesa are filled in with a first current blocking layer having the different conductivity type from that of the substrate and a second current blocking layer having the same conductivity type as that of the substrate, and wherein a buried layer having the different conductivity type from that of the substrate is disposed over the second current blocking layer.

12. The semiconductor laser device of claim 11, wherein the cladding layers, the current blocking layers and the buried layer are made of a material selected from the group consisting of GaAs, AlGaAs, InGaP and InGaAsP.

13. The semiconductor laser device of claim 1, wherein the multi-layer structure further includes:
    a semiconductor multi-layer mirror, which has the same conductivity type as that of the substrate and is located below the active layer; and
    a semiconductor multi-layer mirror, which has a different conductivity type from that of the substrate and is located above the active layer,
    and wherein the pair of semiconductor multi-layer mirrors constitute a vertical laser cavity,
    and wherein laser light generated inside the laser cavity is emitted in a direction vertical to the substrate.

14. The semiconductor laser device of claim 13, wherein at least one of the pair of semiconductor multi-layer mirrors includes an AlAs/GaAs multi-layer structure.

15. The semiconductor laser device of claim 13, wherein at least one of the pair of semiconductor multi-layer mirrors includes an AlGaAs/GaAs multi-layer structure.

16. A semiconductor laser device comprising a GaP substrate and a multi-layer structure formed on the GaP substrate,
    wherein the multi-layer structure includes an active layer for emitting light,
    and wherein the active layer includes an $InN_xAs_yP_{1-x-y}$ (where $0<x<1$ and $0\leq y<1$) layer that is lattice-matched with the GaP substrate.

17. The semiconductor laser device of claim 16, wherein the active layer has a quantum well structure including at least one well layer and at least two barrier layers,
    wherein the well layer is an $InN_xAs_yP_{1-x-y}$ (where $0<x<1$ and $0\leq y<1$) layer.

18. The semiconductor laser device of claim 17, wherein the barrier layers are made of $GaN_{x'}As_{y'}P_{1-x'-y'}$ (where $0<x'<1$ and $0\leq y'<1$).

19. The semiconductor laser device of claim 16, wherein the multi-layer structure further comprises:
    a first cladding layer, which has the same conductivity type as that of the substrate and is located below the active layer; and
    a second cladding layer and a contact layer, which have a different conductivity type from that of the substrate and are located above the active layer,
    and wherein an electrode is disposed on the contact layer to be in contact with each other in a stripe region.

20. The semiconductor laser device of claim 19, wherein a portion of the multi-layer structure, including the second cladding layer and the contact layer having the different conductivity type from that of the substrate, is formed in a ridge shape.

21. The semiconductor laser device of claim 16, wherein the multi-layer structure further comprises:
    a first cladding layer, which has the same conductivity type as that of the substrate and is located below the active layer; and
    a second cladding layer, which has a different conductivity type from that of the substrate and is located above the active layer,
    and wherein the second cladding layer having the different conductivity type from that of the substrate has a ridge-shaped portion,
    and wherein a current blocking layer having the same conductivity type as that of the substrate is disposed to sandwich the ridge-shaped portion therebetween,
    and wherein a buried layer having the different conductivity type from that of the substrate is disposed over the current blocking layer.

22. The semiconductor laser device of one of claims 19 to 21, wherein the cladding layers are made of GaP.

23. The semiconductor laser device of claim 21, wherein the cladding layers, the current blocking layer and the buried layer are made of GaP.

24. The semiconductor laser device of claim 16, wherein the multi-layer structure further comprises:
    a first cladding layer, which has the same conductivity type as that of the substrate and is located below the active layer;
    a second cladding layer, which has a different conductivity type from that of the substrate and is located above the active layer;
    a current blocking layer, which has the same conductivity type as that of the substrate and is disposed over the second cladding layer having the different conductivity type from that of the substrate; and
    a buried layer, which has the different conductivity type from that of the substrate and is disposed over the current blocking layer,
    wherein a part of the buried layer is in contact with the second cladding layer having the different conductivity type from that of the substrate in a stripe region.

25. The semiconductor laser device of claim 24, wherein the cladding layers, the current blocking layer and the buried layer are made of GaP.

26. The semiconductor laser device of claim 16, wherein the multi-layer structure further comprises:
    a first cladding layer, which has the same conductivity type as that of the substrate and is located below the active layer; and
    a second cladding layer and a contact layer, which have a different conductivity type from that of the substrate and are located above the active layer,
    and wherein a part of the GaP substrate and a portion including the cladding layers and the active layer are formed to have a mesa shape,
    and wherein both side regions of the mesa are filled in with a first current blocking layer having the different conductivity type from that of the substrate and a second current blocking layer having the same conductivity type as that of the substrate,
    and wherein a buried layer having the different conductivity type from that of the substrate is disposed over the second current blocking layer.

27. The semiconductor laser device of claim 26, wherein the cladding layers, the current blocking layers and the buried layer are made of GaP.

28. A semiconductor laser device comprising an Si substrate and a multi-layer structure formed on the Si substrate,
    wherein the multi-layer structure includes an active layer for emitting light,
    and wherein the active layer includes an $InN_xAs_yP_{1-x-y}$ (where $0<x<1$ and $0\leq y<1$) layer that is lattice-matched with the Si substrate.

29. The semiconductor laser device of claim 28, wherein the active layer has a quantum well structure including at least one well layer and at least two barrier layers,
    wherein the well layer is an $InN_xAs_yP_{1-x-y}$ (where $0<x<1$ and $0\leq y<1$) layer.

30. An optical communication system comprising the semiconductor laser device recited in one of claims 1 to 29.

31. A semiconductor laser device comprising a GaAs substrate and a multi-layer structure formed on the GaAs substrate, wherein the multi-layer structure includes an active layer for emitting light, and wherein the active layer includes an $InN_xAs_yP_{1-x-y}$ (where 0<x<1 and 0≦y<1) layer, and wherein a transistor for supplying the active layer with current is integrated on the GaAs substrate.

32. A semiconductor laser device comprising an Si substrate and a multi-layer structure formed on the Si substrate, wherein the multi-layer structure includes an active layer for emitting light, and wherein the active layer includes an $InN_xAs_yP_{1-x-y}$ (where 0<x<1 and 0≦y<1) layer, and wherein a transistor for supplying the active layer with current is integrated on the Si substrate.

33. A semiconductor laser device comprising an Si substrate and a multi-layer structure formed on the Si substrate, wherein the multi-layer structure includes an active layer for emitting light, and wherein the active layer includes an $InN_xAs_yP_{1-x-y}$ (where 0<x<1 and 0≦y<1) layer, and wherein a recessed portion for supporting an optical fiber receiving laser light emitted from the active layer is formed in the Si substrate.

34. The semiconductor laser device of claim 33, wherein at least part of the optical fiber is supported by the recessed portion of the Si substrate.

35. The semiconductor laser device of claim 34, wherein a transistor for supplying the active layer with current is integrated on the Si substrate.

36. A method for fabricating a semiconductor laser device, comprising the steps of:

forming a multi-layer structure including an $InN_xAs_yP_{1-x-y}$ (where 0<x<1 and 0≦y<1) layer on a semiconductor substrate;

forming a laser cavity and a reflective surface thereof by patterning the multi-layer structure; and forming a transistor on the semiconductor substrate.

37. The method of claim 36, further comprising the step of forming, in the semiconductor substrate, a recessed portion for supporting an optical fiber receiving laser light emitted from the active layer.

38. The method of claim 37, further comprising the step of disposing at least part of the optical fiber in the recessed portion of the semiconductor substrate.

39. A method for producing a compound semiconductor by growing $InN_xAs_yP_{1-x-y}$ (where 0<x<1 and 0≦y<1) on a substrate, made of a semiconductor material selected from the group consisting of InP, GaAs, GaP and Si, by the use of a gas containing arsenic, a gas containing phosphorus, an organometallic gas containing indium and an organometallic gas containing nitrogen.

40. The method of claim 39, wherein the gas containing arsenic is $AsH_3$ (arsine).

41. The method of claim 39, wherein the gas containing phosphorus is $PH_3$ (phosphine).

42. The method of claim 39, wherein the gas containing arsenic is $As(C_4H_9)H_2$ (tertiarybutylarsine).

43. The method of claim 39, wherein the gas containing phosphorus is $P(C_4H_9)H_2$ (tertiarybutylphosphine).

44. The method of claim 39, wherein the gas containing arsenic is $As(C_4H_9)H_2$ (tertiarybutylarsine) and the gas containing phosphorus is $P(C_4H_9)H_2$ (tertiarybutylphosphine).

45. The method of claim 39, wherein the gas containing nitrogen is an organometallic gas selected from the group consisting of $CH_3N_2H_3$ (monomethylhydrazine), $(CH_3)_2N_2H_2$ (dimethylhydrazine) and $t-C_4H_9N_2H_3$ (tertiarybutylhydrazine) gases.

46. The method of claim 44, wherein the gas containing nitrogen is an organometallic gas selected from the group consisting of $CH_3N_2H_3$ (monomethylhydrazine), $(CH_3)_2N_2H_2$ (dimethylhydrazine) and $t-C_4H_9N_2H_3$ (tertiarybutylhydrazine) gases.

47. The method of one of claims 39 to 46, wherein an inert gas having a molecular weight larger than the molecular weight of hydrogen is used as a carrier gas.

48. The method of one of claims 39 to 46, wherein nitrogen is used as a carrier gas.

49. The method of one of claims 39 to 46, wherein argon is used as a carrier gas.

* * * * *